(12) United States Patent  
Tsuruoka et al.

(10) Patent No.: US 9,455,359 B2  
(45) Date of Patent: Sep. 27, 2016

(54) SOLAR BATTERY CELL, SOLAR BATTERY MODULE AND METHOD OF MAKING SOLAR BATTERY MODULE

(75) Inventors: Yasuo Tsuruoka, Chikusei (JP); Kenzou Takemura, Chikusei (JP); Yusuke Asakawa, Chikusei (JP); Masaki Fujii, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 777 days.

(21) Appl. No.: 13/483,603

(22) Filed: May 30, 2012

(65) Prior Publication Data

US 2012/0305048 A1 Dec. 6, 2012

Related U.S. Application Data

(60) Provisional application No. 61/491,720, filed on May 31, 2011.

(51) Int. Cl.
*H01L 31/0224* (2006.01)
*H01L 31/05* (2014.01)

(52) U.S. Cl.
CPC ... *H01L 31/022433* (2013.01); *H01L 31/0504* (2013.01); *H01L 31/0512* (2013.01); *Y02E 10/50* (2013.01)

(58) Field of Classification Search
CPC .................. H01L 31/022433; H01L 31/0504
USPC ....................................................... 136/244
See application file for complete search history.

(56) References Cited

U.S. PATENT DOCUMENTS

| 2007/0128827 A1* | 6/2007 | Faris ............................. 438/455 |
| 2008/0121265 A1 | 5/2008 | Hishida et al. |
| 2010/0000602 A1 | 1/2010 | Gray et al. |
| 2010/0263705 A1* | 10/2010 | Ide ..................... H01L 31/1804 136/244 |

(Continued)

FOREIGN PATENT DOCUMENTS

| CN | 1606175 A | 4/2005 |
| CN | 1917236 A | 2/2007 |

(Continued)

OTHER PUBLICATIONS

English translation of International Preliminary Report on Patentability from International Patent Application No. PCT/JP2012/063895, mailed Dec. 27, 2013.

(Continued)

*Primary Examiner* — Jayne Mershon
(74) *Attorney, Agent, or Firm* — Fitch, Even, Tabin and Flannery LLP

(57) ABSTRACT

A solar battery cell and related methodology are provided which enable a TAB wire to be accurately connected to an intended position, thus allowing a possible increase in manufacturing costs to be suppressed. The solar battery cell can include a substrate, a plurality of finger electrodes formed on a light receiving surface of the substrate, and a back surface electrode on a back surface of the substrate, the back surface electrode to be connected to a plurality of finger electrodes on an adjacent cell by applying a first TAB wire via a conductive adhesive, wherein the back surface electrode has omitted portions arranged to define at least one alignment marking indicative of a position where the first TAB wire is to be applied, the at least one alignment marking having a width less than a width of said first TAB wire.

36 Claims, 14 Drawing Sheets

(56) References Cited

U.S. PATENT DOCUMENTS

| | | | |
|---|---|---|---|
| 2011/0011454 A1 | 1/2011 | Taira | |
| 2011/0014725 A1* | 1/2011 | Abiko et al. | ................ 438/4 |
| 2011/0088746 A1 | 4/2011 | Hong et al. | |
| 2012/0031457 A1 | 2/2012 | Taira et al. | |
| 2012/0125396 A1* | 5/2012 | Taira et al. | ............ 136/244 |

FOREIGN PATENT DOCUMENTS

| | | | |
|---|---|---|---|
| CN | 101395722 A | | 3/2009 |
| CN | 101779298 A | | 7/2010 |
| CN | 101826569 A | | 9/2010 |
| CN | 101939873 A | | 1/2011 |
| CN | 101976692 A | | 2/2011 |
| CN | 202651127 U | | 1/2013 |
| JP | H08-008452 A | | 1/1996 |
| JP | 08-330615 A | | 12/1996 |
| JP | 2000-261012 A | | 9/2000 |
| JP | 2001-068699 A | | 3/2001 |
| JP | 2002-263880 A | | 9/2002 |
| JP | 2003-133570 A | | 5/2003 |
| JP | 2004-204256 A | | 7/2004 |
| JP | 2005-243935 A | | 9/2005 |
| JP | 2007-265635 A | | 10/2007 |
| JP | 2008-85225 A | | 4/2008 |
| JP | 2008-135652 A | | 6/2008 |
| JP | 2008-135655 A | | 6/2008 |
| JP | 2009-295860 | * | 12/2009 |
| JP | 2009-295860 A | | 12/2009 |
| JP | 2009-295940 A | | 12/2009 |
| JP | 2010-027778 A | | 2/2010 |
| JP | WO 2011-013814 | * | 3/2011 |
| JP | 2011-171722 A | | 9/2011 |
| JP | 2012-019078 A | | 1/2012 |
| WO | WO 2007/001004 A1 | | 1/2007 |
| WO | 2009017174 A1 | | 2/2009 |
| WO | WO 2009/099179 A1 | | 8/2009 |
| WO | 2010/125679 A1 | | 4/2010 |
| WO | 2010/095583 A1 | | 8/2010 |
| WO | 2011/021655 A1 | | 2/2011 |
| WO | WO 2011/013814 A2 | | 2/2011 |

OTHER PUBLICATIONS

English translation of International Preliminary Report on Patentability from International Patent Application No. PCT/JP2012/056012, mailed Sep. 19, 2013.

English translation of International Preliminary Report on Patentability from International Patent Application No. PCT/JP2012/056013, mailed Sep. 19, 2013.

International Search Report dated Apr. 17, 2012 in International Application No. PCT/JP2012/056012.

International Search Report dated Apr. 17, 2012 in International Application No. PCT/JP2012/056013.

U.S. Appl. No. 13/414,775, filed Mar. 8, 2012.

U.S. Appl. No. 13/414,807, filed Mar. 8, 2012.

Office Action dated Nov. 20, 2014 in U.S. Appl. No. 13/414,775.

Office Action in CN Appln. No. 201210060091.9 (not counterpart application) dated Jul. 27, 2015.

Office Action in U.S. Appl. No. 13/414,775 (not counterpart application) dated Aug. 10, 2015.

Office Action in counterpart CN Patent Application No. 201210177989.4 dated Feb. 22, 2016.

Office Action in JP 2013-503613 dated Jan. 26, 2016.

Office Action in JP 2013-503614 dated Jan. 19, 2016.

Office Action in counterpart Appln. No. P2012-278212 dated Feb. 16, 2016.

Office Action of U.S. Appl. No. 13/414,775 dated May 27, 2016.

Office Action of CN. Appln. 201210060091.9 dated May 16, 2016.

* cited by examiner

SOLAR BATTERY CELL, SOLAR BATTERY MODULE AND METHOD OF MAKING SOLAR BATTERY MODULE

CROSS-REFERENCE TO RELATED APPLICATION

This application claims the benefit of U.S. Provisional Patent Application No. 61/491,720, filed May 31, 2011.

BACKGROUND OF THE INVENTION

1. Field of the Invention

The present invention relates to a solar battery cell, a solar battery module and a method of making solar battery module.

2. Related Background Art

In recent years, much attention has been paid to solar batteries as means for solving increasingly serious global warming and fossil energy depletion problems. A solar battery is normally formed by connecting a plurality of solar battery cells together in series or parallel. The solar battery cell includes a plurality of linear electrodes (finger electrodes) arranged in parallel on a front surface (light receiving surface) thereof and formed of Ag in order to provide power. A back surface electrode formed of Al is formed all over a back surface of the solar battery cell. Then, adjacent solar battery cells are connected together by connecting a metal wiring member (TAB wire) to the light receiving surface of one of the adjacent solar battery cells so that the metal wiring member crosses the all the finger electrodes and further connecting the TAB wire to the back surface electrode of the other solar battery cell.

Solder exhibiting proper conductivity is conventionally used to connect the TAB wire (Japanese Patent Laid-Open No. 2002-263880). Furthermore, in some cases, Sn—Ag—Cu solder, which contains no Pb, has recently been used with environmental problems taken into account (Japanese Patent Laid-Open Nos. 2002-263880 and 2004-204256). However, when these solders are used to connect the TAB wire, the solar battery cells are heated at about 220° C. or higher. Thus, the yield of the connection step may decrease or the solar battery cells may be warped. To suppress this, silicon in the solar battery cells may be increased in thickness. However, in this case, manufacturing costs increase.

Furthermore, when such solder as described is used to connect the TAB wire, the following measure needs to be taken in order to ensure wettability of the solder: electrodes (bus bar electrodes) formed of Ag is preformed on the front and back surfaces of the solar battery cell at the positions where the TAB wires are located. However, Ag is expensive, thus contributing to increasing costs. Additionally, Ag offers high electric resistance, and thin bus bar electrodes thus offer high sheet resistance. This increases power loss, thereby reducing the power generation performance of the solar battery cells. Thus, to suppress the sheet resistance of the bus bar electrodes, the bus bar electrodes need to be increased in width to some degree. This further increases the manufacturing costs.

Hence, in recent years, a method has been proposed in which a conductive adhesive with a conductive adhesion layer is used instead of the solder to connect the TAB wire (Japanese Patent Laid-Open Nos. 8-330615, 2003-133570, 2005-243935, and 2007-265635). The conductive adhesive is a thermosetting resin in which metal particles such as Al particles are mixed and dispersed. The metal particles are sandwiched between the TAB wire and the electrode of the solar battery cell to achieve electric connection. If the conductive adhesive is used to connect the TAB wire, the connection can be carried out at 200° C. or lower. This suppresses a decrease in the yield of the connection step and the warpage of the solar battery cells. Furthermore, if the conductive adhesive is used to connect the TAB wire, the wettability need not be ensured. This in turn eliminates the need for the bus bar electrodes, formed to ensure the wettability, thus reducing the use of Ag.

However, avoidance of formation of bus bar electrodes on the front or back surface of the solar battery cell prevents identification of the position where the TAB wires are connected. This may preclude the TAB wires from being accurately stuck to intended positions. When the TAB wires fail to be stuck to the intended positions, the lines of the solar battery cells may meander. Then, a residual stress may be generated in the solar battery cells, and the manufacturing yield may decrease. In this case, additional alignment marks for alignment may be formed at the intended adhesion positions. However, a complicated step of forming alignment marks increases the manufacturing costs.

The present invention has been made to solve the above-described problems. An object of the present invention is to provide a solar battery cell that enables the TAB wire to be accurately connected to the intended position, while allowing a possible increase in manufacturing costs to be suppressed.

SUMMARY OF THE INVENTION

According to one of its broad concepts, the present invention provides a solar battery cell, including a substrate, a plurality of finger electrodes formed on a light receiving surface of the substrate, and a back surface electrode substantially covering a back surface of the substrate, the back surface electrode to be connected to a plurality of finger electrodes on an adjacent cell by applying a first TAB wire via a conductive adhesive, wherein a portion of the back surface of the substrate is exposed at a position corresponding to a position on the light receiving surface where a second TAB wire is to be applied, and the exposed portion constitutes an alignment marking of the back surface indicative of a position where the first TAB wire is to be applied.

According to another of its broad concepts, the invention provides a solar battery cell, including a substrate, a plurality of finger electrodes formed on a light receiving surface of the substrate, and a back surface electrode substantially covering a back surface of the substrate, the back surface electrode to be connected to a plurality of finger electrodes on an adjacent cell by applying a first TAB wire via a conductive adhesive, wherein the back surface electrode has omitted portions arranged to define at least one alignment marking indicative of a position where the first TAB wire is to be applied, the at least one alignment marking having a width less than a width of said first TAB wire.

In one of its aspects, a solar battery cell of the invention includes a substrate, a plurality of finger electrodes formed on a light receiving surface of the substrate parallel to one another, and a back surface electrode formed all over a back surface of the substrate, the back surface electrode being connected to a plurality of finger electrodes on an adjacent cell by applying a TAB wire via a conductive adhesive, wherein an exposed portion is formed on the back surface in such a manner that the substrate is exposed from the exposed portion in association with a position on the light receiving surface where the TAB wire is to be connected, and the exposed portion corresponds to an alignment marking (also referred to throughout the specification as an alignment mark or marks) indicative of the position on the back surface where the TAB wire is to be connected.

In the solar battery cell according to the present invention, the exposed portion is formed on the back surface in such a manner that the substrate is exposed from the exposed portion in association with the position on the light receiving surface where the TAB wire is to be connected, and the exposed portion corresponds to the alignment mark indicative of the position on the back surface where the TAB wire is to be connected. Thus, the TAB wire can be accurately connected to an intended position. Furthermore, the alignment mark can be easily formed by avoiding applying an electrode material to a portion of the back surface which corresponds to the alignment mark when the back surface electrode is formed. Hence, a possible increase in manufacturing costs can be suppressed.

Here, preferably, the alignment mark is shaped like a line with a smaller line width than the TAB wire to be connected. This results in a sufficient adhesion area between the TAB wire and the substrate and provides the TAB wire with a sufficient mechanical connection strength.

Furthermore, preferably, the alignment mark is shaped like a line including portions smaller, in line width, than the TAB wire to be connected and portions equal to or greater than the TAB wire in line width, the portions smaller than the TAB wire in length and the portions equal to or greater than the TAB wire in length being consecutively alternately formed. This results in a sufficient adhesion area between the TAB wire and the substrate and provides the TAB wire with a higher mechanical connection strength in the portions equal to or greater than the TAB wire in line width.

Additionally, preferably, the alignment mark is shaped like a dashed line. This results in a sufficient adhesion area between the TAB wire and the substrate and provides the TAB wire with a sufficient mechanical connection strength in the exposed portion of the substrate.

In addition, preferably, the alignment mark is shaped like a cutout at an end of the substrate located on an extension of the TAB wire to be connected. This allows the portion of the back surface which corresponds to the alignment mark to be easily set when the back surface electrode is formed. As a result, the back surface electrode can be easily formed.

Furthermore, the present invention provides a solar battery module including a plurality of the solar battery cells arranged therein, wherein finger electrodes on one of the adjacent solar battery cells are connected to a back surface electrode on the other solar battery cell by a TAB wire arranged along an alignment mark via a conductive adhesive.

In the solar battery module according to the present invention, the TAB wire is accurately connected to an intended position. This restrains the array of the solar battery cells from meandering. Thus, when the solar battery module is manufactured, possible residual stress in the solar battery cells can be suppressed. Hence, manufacturing yield can be improved.

Furthermore, a solar battery module of the invention includes a plurality of the solar battery cells of the invention as described above, wherein the first TAB wire is positioned along the alignment marking on one of the plurality of solar battery cells and is connected to the back surface electrode of said one solar battery cell via said conductive adhesive, and the first TAB wire is further connected, as the second TAB wire, to the plurality of finger electrodes of another of the plurality of solar battery cells.

According to yet another broad concept of the invention, a method of making a solar battery module comprises: providing a photovoltaic substrate having a plurality of finger electrodes arranged on a light receiving surface thereof, and an alignment marking provided on the light receiving surface and indicating a position where a second TAB wire is to be connected to the finger electrodes via a conductive adhesive, and a back surface electrode substantially covering a back surface of the substrate, the back surface electrode to be connected to a plurality of finger electrodes on an adjacent cell by applying a first TAB wire via a conductive adhesive, wherein a portion of the back surface of the substrate is exposed at a position corresponding to said position on the light receiving surface where the second TAB wire is to be applied, and the exposed portion constitutes an alignment marking indicative of a position where the first TAB wire is to be applied; and connecting the first TAB wire to the back surface electrode via the conductive adhesive at the position indicated by the alignment marking of the back surface.

According to still another broad concept of the invention, a method of making a solar battery module comprises providing a photovoltaic substrate having a plurality of finger electrodes arranged on a light receiving surface thereof, and a back surface electrode substantially covering a back surface of the substrate, the back surface electrode to be connected to a plurality of finger electrodes on an adjacent cell by applying a first TAB wire via a conductive adhesive, wherein the back surface electrode has omitted portions arranged to define at least one alignment marking of the back surface indicative of a position where the first TAB wire is to be applied, the at least one alignment marking of the back surface having a width less than a width of said first TAB wire; and connecting the first TAB wire to the back surface electrode via the conductive adhesive at the position indicated by the alignment marking of the back surface.

The present invention can provide a solar battery cell and related methodology which enable the TAB wire to be accurately connected to the intended position, while allowing a possible increase in manufacturing costs to be suppressed.

DESCRIPTION OF THE PREFERRED EMBODIMENTS

Figure 1:
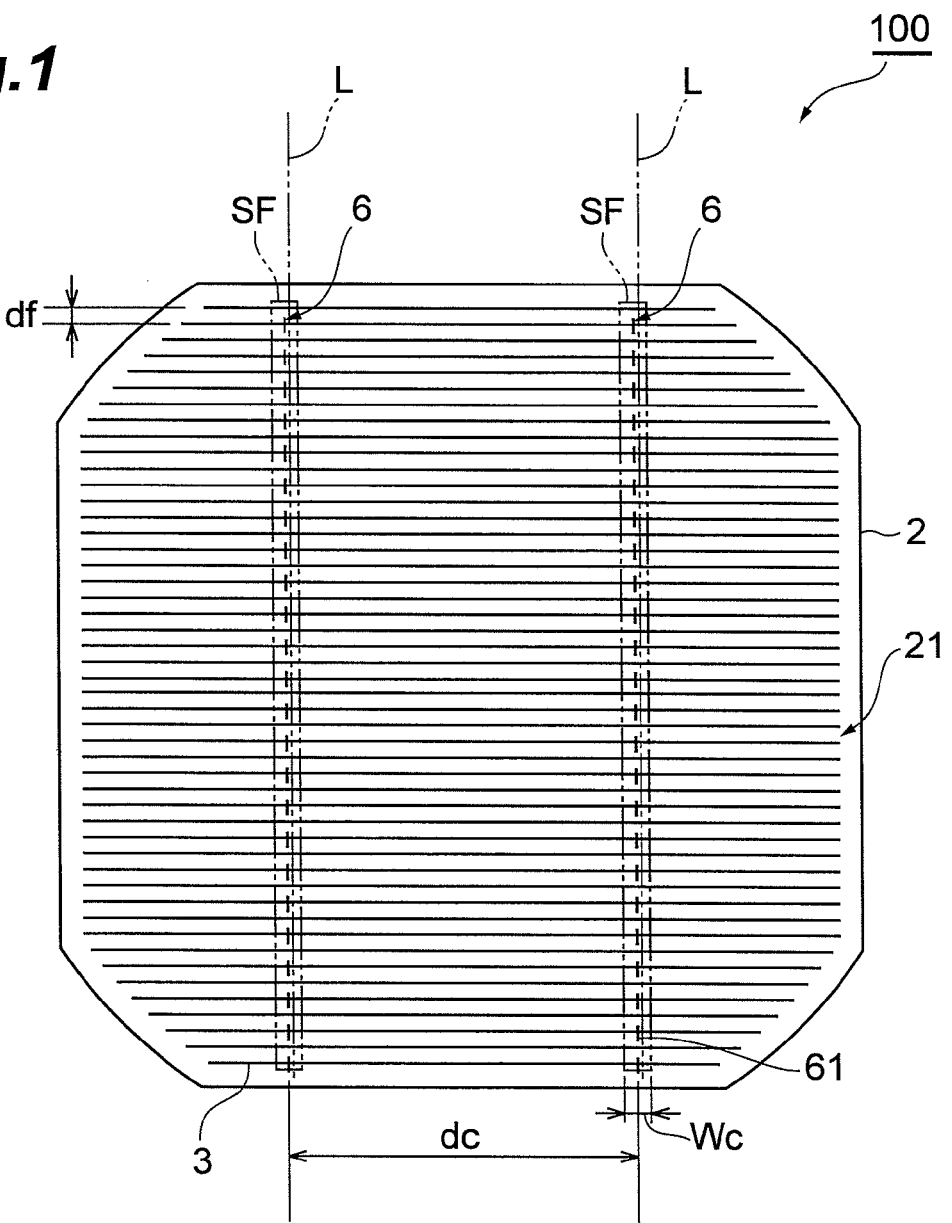
FIG. 1 is a plan view showing a light receiving surface of a solar battery cell according to a first embodiment of the present invention.

Preferred embodiments of a solar battery cell and a method for manufacturing the solar battery cell according to the present invention will be described below in detail with reference to the drawings. The same elements are denoted by the same reference numerals, and duplicate descriptions are omitted.

Figure 2:
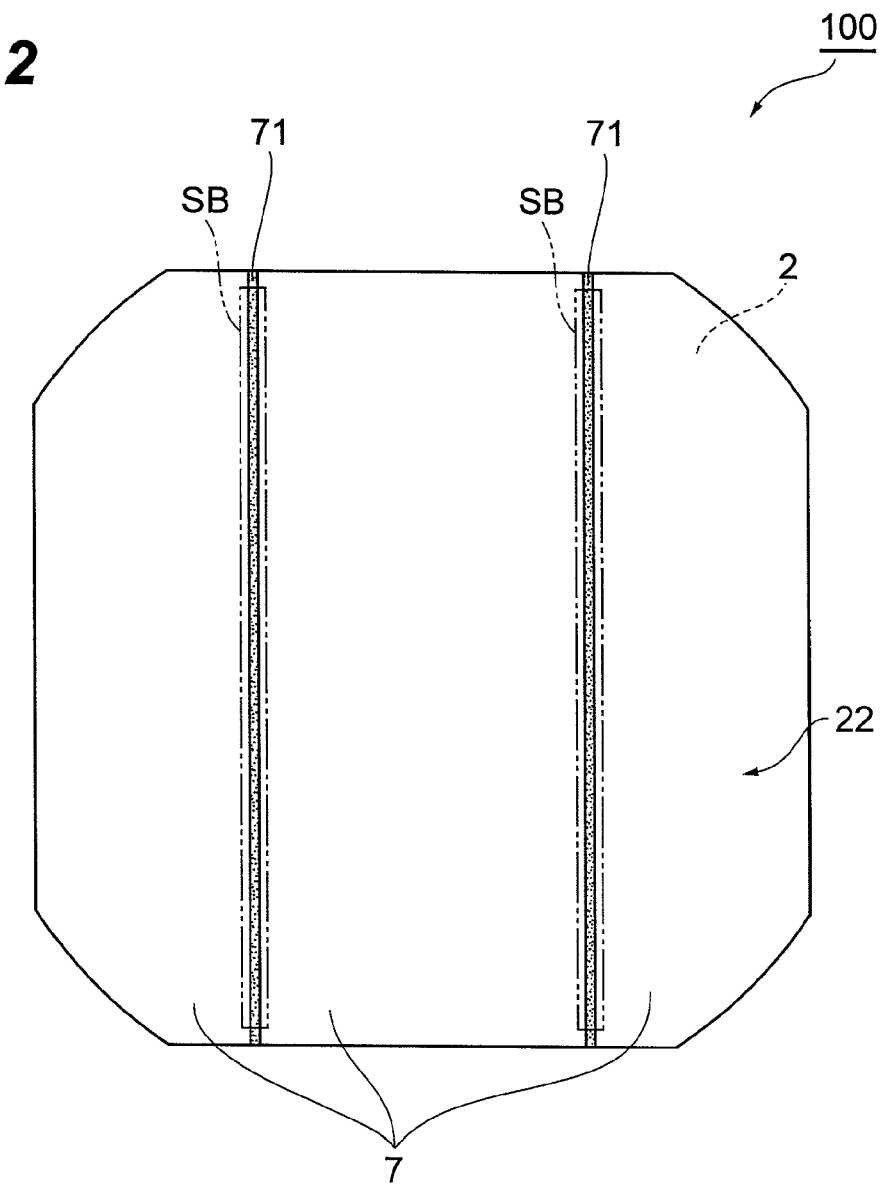
FIG. 2 is a bottom view showing a back surface of the solar battery cell in FIG. 1.
Figure 3:
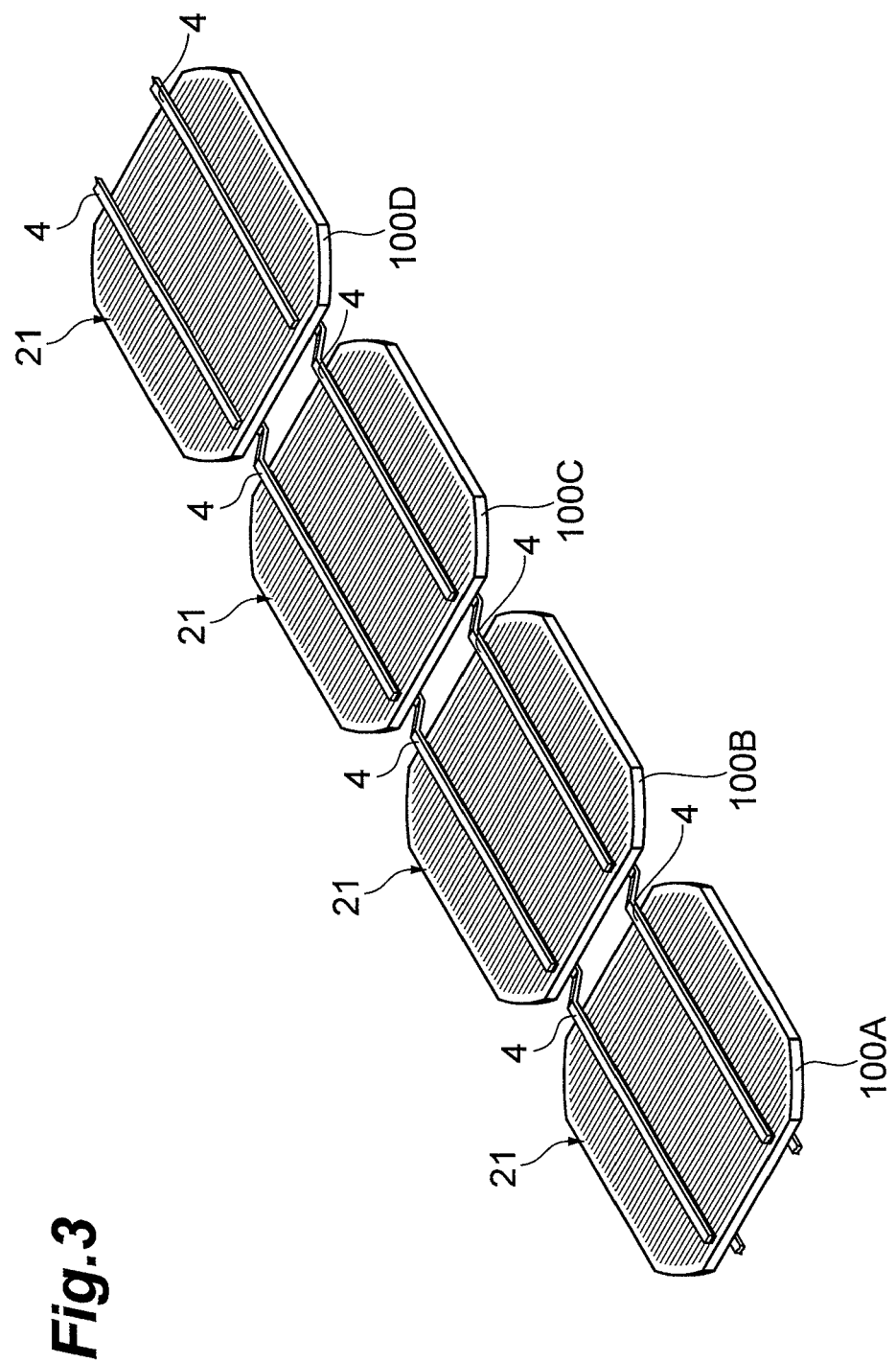
FIG. 3 is a perspective view showing that a plurality of the solar battery cells in FIG. 1 are connected together.
Figure 4:
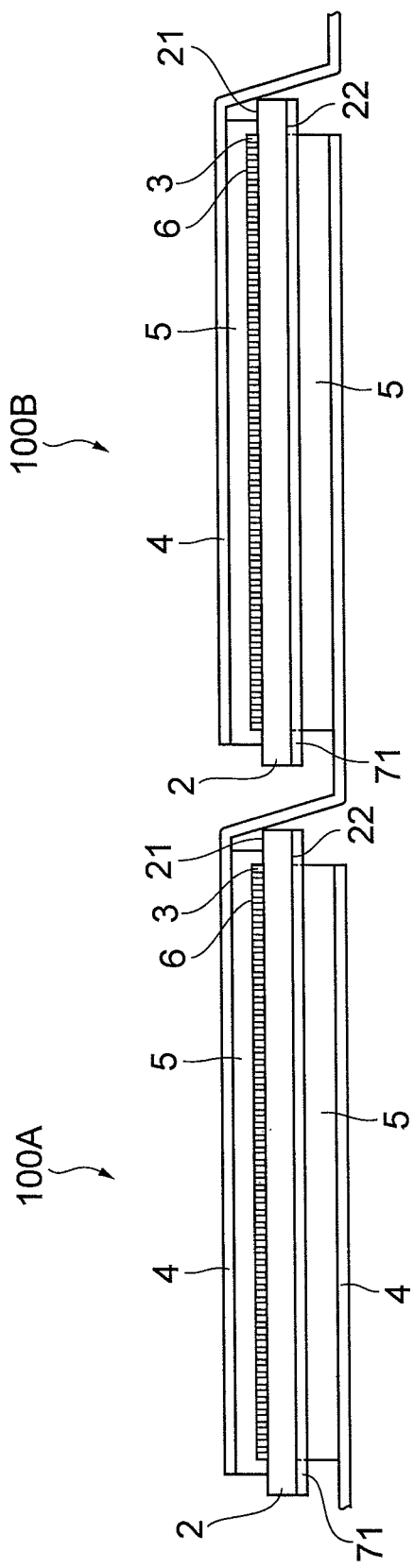
FIG. 4 is a schematic side view of FIG. 3.

FIG. 1 is a plan view showing a light receiving surface of a solar battery cell according to a first embodiment of the present invention. FIG. 2 is a bottom view showing a back surface of the solar battery cell in FIG. 1. FIG. 3 is a perspective view showing that a plurality of the solar battery cells in FIG. 1 are connected together. FIG. 4 is a schematic side view of FIG. 3.

As shown in FIG. 1, a solar battery cell 100 is such that a plurality of the solar battery cells 100 are electrically connected together in series or parallel to form one solar battery module. The solar battery cell 100 includes a substrate 2. The substrate 2 is generally square and has four circular-arc corners. One surface of the substrate 2 corresponds to a light receiving surface 21. The other surface of the substrate 2 corresponds to a back surface 22 (see FIG. 2). The substrate 2 may be formed of at least one of a single crystal of Si, a polycrystal of Si, and a non-crystal of Si. On the light receiving surface 21 side, the substrate 2 may be formed of an n- or p-type semiconductor. On the substrate 2, for example, the distance between two opposite sides is 125 mm.

A plurality of (for example, 48) linear finger electrodes 3 are arranged on the light receiving surface 21 parallel to and away from one another. When a plurality of the solar battery cells 100 are connected together to form a solar battery module, TAB wires 4 are connected to the finger electrodes 3 via respective conductive adhesion films (conductive adhesives) 5 (see FIG. 4). Each of the finger electrodes 3 is, for example, 0.15 mm in line width. The distance df between the adjacent finger electrodes 3 is, for example, 2.55 mm.

Each of the finger electrodes 3 is formed of a known material providing electric continuity. Examples of the material of the finger electrode 3 include a glass paste containing silver; a silver paste, a gold paste, a carbon paste, a nickel paste, and an aluminum paste each containing an adhesive resin with one of the various types of conductive particles dispersed therein; and ITO formed by burning or deposition. Among these materials, the glass paste containing silver is preferably used in terms of heat resistance, electric conductivity, stability, and costs.

Adhesion areas SF, SF correspond to areas of the light receiving surface 21 to which the conductive adhesion films 5, 5 are applied. The width we of the adhesion area SF (that is, the width of the conductive adhesion film 5) is, for example, 1.2 mm. The distance dc between the adhesion areas SF and SF is, for example, 62 mm. Furthermore, the width of the TAB wire 4 to be connected to the adhesion area SF is, for example, 1.5 mm and is slightly greater than the width we of the adhesion area SF (that is, the width of the conductive adhesion film 5). The purpose of these dimensions is as follows: when the TAB wire 4 is compressed against the conductive adhesion film 5 applied to the adhesion area SF, the conductive adhesion film 5 is restrained from sticking out from between the light receiving surface 21 and the TAB wire 4.

Light receiving surface alignment marks 6, 6 are discontinuously provided on the light receiving surface 21 along a line L so as to form dashed lines; the line L crosses the finger electrodes 3, 3 positioned at the opposite ends of the light receiving surface. More specifically, portions 61 of the light receiving surface alignment mark 6 each of which crosses only one finger electrode 3 are consecutively provided on every other finger electrode 3 along the line L. The light receiving surface alignment mark 6 is indicative of a position where the TAB wire 4 is connected to the finger electrodes 3. For example, the light receiving surface alignment mark 6 is arranged in a central portion of the adhesion area SF.

The light receiving surface alignment mark 6 is formed integrally with the finger electrodes 3 using the same material as that of the finger electrodes 3. That is, the light receiving surface alignment mark 6 is formed of a glass paste containing silver; a silver paste, a gold paste, a carbon paste, a nickel paste, or an aluminum paste containing an adhesive resin with one of the various types of conductive particles dispersed therein; or ITO formed by burning or deposition. Among these materials, the glass paste containing silver is preferably used in terms of heat resistance, electric conductivity, stability, and costs. The light receiving surface alignment marks 6 are formed simultaneously with formation of the finger electrodes 3.

Each portion 61 of the light receiving surface alignment mark 6 is at least 0.05 mm and at most 0.2 mm, for example, 0.15 mm in line width, similarly to the finger electrode 3 according to the present embodiment. That is, each portion 61 of the light receiving surface alignment mark 6 is equal to or smaller than the finger electrode 3 in line width. When the light receiving surface alignment mark 6 is at least 0.05 mm in line width, visual identification is ensured, allowing the light receiving surface alignment mark 6 to function as an alignment mark. Furthermore, when the light receiving surface alignment mark 6 is at most 0.2 mm in line width, the usage of the electrode material can be sufficiently reduced. Moreover, when the light receiving surface alignment mark 6 is equal to or smaller than the finger electrode 3 in line width, the usage of the electrode material can be further reduced. Alternatively, each portion 61 of the light receiving surface alignment mark 6 is preferably at most 20%, in line width, of the TAB wire to which the light receiving surface alignment mark 6 is connected. The distance between the light receiving surface alignment marks 6, 6 is 62 mm similarly to the distance dc between the adhesion areas SF, SF.

As shown in FIG. 2, the back surface electrode 7 is formed all over the back surface 22 of the solar battery cell 100. When a solar battery module is formed by connecting a plurality of the solar battery cells 100 together, the TAB wire 4 is connected to the back surface electrode 7 via the conductive adhesion film 5 (see FIG. 4). The back surface electrode 7 is formed by, for example, sintering an aluminum paste.

Adhesion areas SB, SB correspond to areas of the back surface 22 to which the conductive adhesion film 5 is applied. The adhesion areas SB, SB are positioned in association with the adhesion areas SF of the light receiving surface 21. The width of the adhesion area SB is, for example, 1.2 mm, like the width we of the adhesion area SF (see FIG. 1). The distance between the adhesion areas SB and SB is, for example, about 62 mm, like the distance dc between the adhesion areas SF and SF (see FIG. 1). Furthermore, the width of the TAB wire 4 to be connected to the adhesion area SB is, for example, 1.5 mm, like the width of the TAB wire to be connected to the light receiving surface 21, and is slightly greater than the width of the adhesion area SB.

Exposed portions from which the substrate 2 is exposed are formed on the back surface 22 in association with the respective positions on the light receiving surface 21 where the corresponding TAB wires 4 are connected. The exposed portions correspond to back surface alignment marks 71, 71 indicative of the respective positions on the back surface 22 where the corresponding TAB, wires 4 are connected. Each of the back surface alignment marks 71 is linearly formed along the adhesion area SB so as to join two opposite sides of the substrate 2 together. The back surface alignment mark 71 is arranged, for example, in a central portion of the adhesion area SB. The back surface alignment mark 71 is visually easily identifiable because Al, the material of the back surface electrode 7, is different from Si, the material of the substrate 2, in color.

When the TAB wire 4 is connected to the back surface electrode 7 via the conductive adhesion film 5, the conductive adhesion film 5 and the back surface electrode 7 need to inevitably contact each other in order to electrically connect the TAB wire 4 to the back surface electrode 7. Thus, the back surface alignment mark 71 needs to be smaller than the TAB wire 4 in width. On the other hand, in view of cohesive fracture of the back surface electrode 7 resulting from curing of the conductive adhesion film 5, a certain adhesion area (that is, the width of the back surface alignment mark 71) is preferably provided between the conductive adhesion film 5 and the substrate 2. The width of the back surface alignment mark 71 is preferably about 20% to 80% of the width of the TAB wire 4, and is, for example, about 0.6 mm according to the present embodiment. The distance between the back surface alignment marks 71 and 71 is, for example, 62 mm, like the distance between the adhesion areas SB and SB.

As shown in FIG. 3, a plurality of such solar battery cells 100 are arranged in a line so that each light receiving surface alignment mark 6 and the corresponding back surface alignment mark 71 lie in alignment with each other. The solar battery cells 100 are coupled together via the TAB wires 4 each arranged along the corresponding light receiving surface alignment mark 6 and back surface alignment mark 71 via the corresponding conductive adhesion film 5. The coupling is achieved by connecting the finger electrodes 3 on the light receiving surface 21 side of a solar battery cell 100A to the back surface electrode 7 on the back surface 22 side of a solar battery cell 100B adjacent to the solar battery cell 100A, by means of the corresponding TAB wires 4 (see FIG. 4), further connecting the finger electrodes 3 on the light receiving surface 21 side of the solar battery cell 100B to the back surface electrode 7 on the back surface 22 side of a solar battery cell 100C adjacent to the solar battery cell 100B, by means of the corresponding TAB wires, and repeating such operations. Thus, the plurality of solar battery cells 100 arranged in a line are electrically connected together in series. One or more such arrays are provided to form a solar battery module.

As described above, in the solar battery cell 100 according to the present embodiment, the exposed portions from which the substrate 2 is exposed are formed on the back surface 22 in association with the respective positions on the light receiving surface 21 where the corresponding TAB wires 4 are connected. Each of the exposed portions corresponds to the back surface alignment mark 71 indicative of the position on the back surface 22 where the corresponding TAB wire 4 is to be connected. Hence, the position where the TAB wire 4 is to be connected can be visually identified so that the TAB wire 4 can be accurately connected to an intended position. Furthermore, the back surface alignment marks 71 can be easily formed by omitting portions of the back surface electrode—for example by avoiding applying an electrode material to portions of the back surface which correspond to the back surface alignment marks 71 when the back surface electrode 7 is formed, or by selectively removing portions of the back surface electrode after it is formed. As a result, a possible increase in manufacturing costs can be suppressed.

Furthermore, in the solar battery cell 100, the back surface alignment mark 71 is shaped like a straight line smaller, in line width, than the TAB wire 4 to be connected. This results in a sufficient adhesion area between the TAB wire 4 and the substrate 2 and provides the TAB wire 4 with a sufficient mechanical connection strength.

Furthermore, in a solar battery module formed of solar battery cells 100, a plurality of the solar battery cells 100 are arranged. The finger electrodes 3 on one of the adjacent solar battery cells 100 are connected to the back surface electrode 7 of the other solar battery cell 100 by the TAB wires 4 each arranged along the corresponding light receiving surface alignment mark 6 and back surface alignment mark 71 via the corresponding conductive adhesion film 5. In such a solar battery module, the TAB wire 4 is accurately connected to the intended position. Thus, the array of the solar battery cells 100 can be restrained from meandering. Hence, when a solar battery module is manufactured, possible residual stress in the solar battery cells 100 can be suppressed, allowing manufacturing yield to be improved.

Now, a solar battery cell according to a second embodiment of the present invention will be described. In the present embodiment, mainly differences from the above-described first embodiment will be described.

Figure 5:
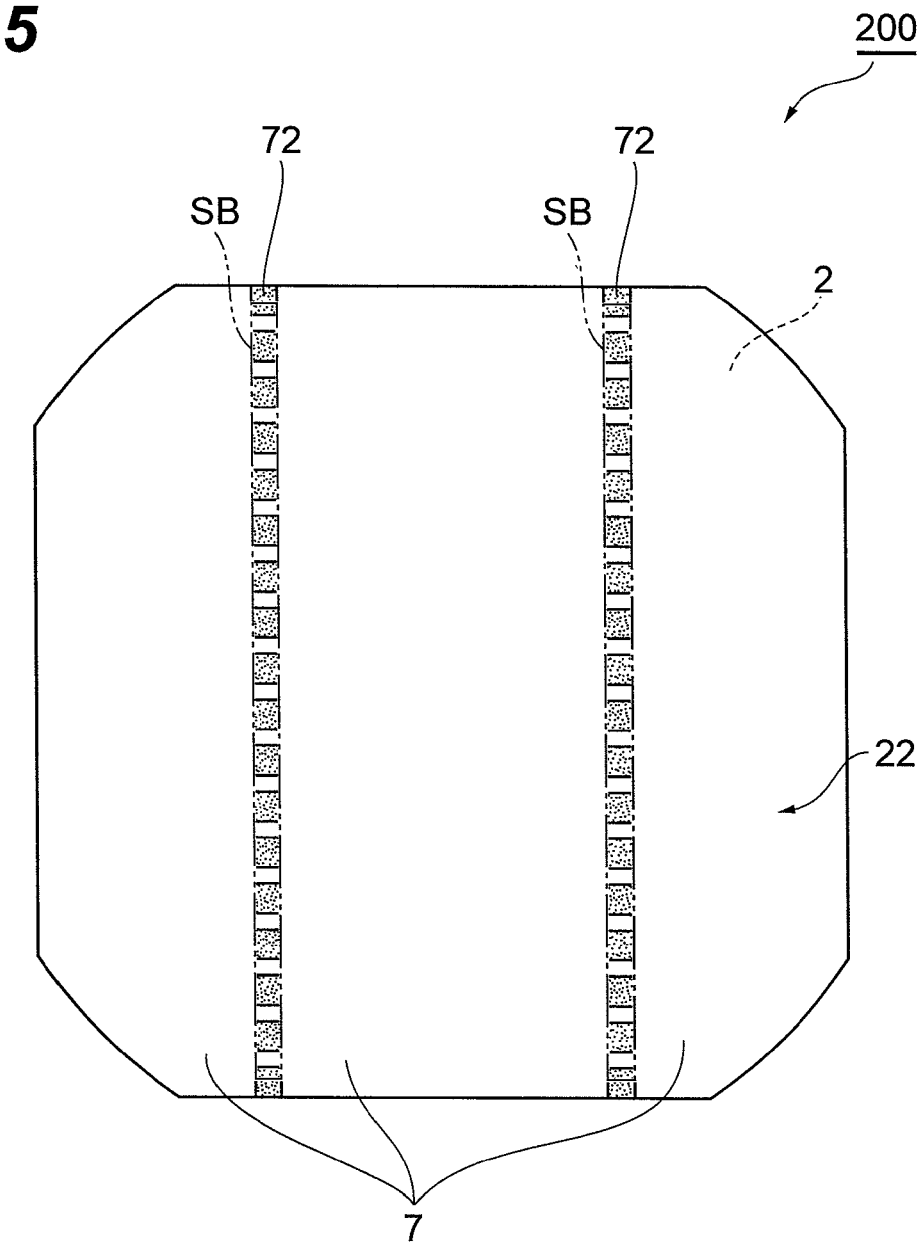
FIG. 5 is a plan view showing a back surface of a solar battery cell according to a second embodiment of the present invention.

FIG. 5 is a plan view showing a back surface of the solar battery cell according to the second embodiment of the present invention. As shown in FIG. 5, a solar battery cell 200 according to the second embodiment is different from the solar battery cell 100 according to the first embodiment (see FIG. 2) in that the solar battery cell 200 includes dashed line-shaped back surface alignment marks 72 instead of the straight line-shaped back surface alignment marks 71.

More specifically, each of the back surface alignment marks 72 is formed like a dashed line along the corresponding adhesion area SB so as to join two opposite sides of the substrate 2 together. In the back surface alignment mark 72, an unexposed portion N from which the substrate 2 is not exposed is interposed between consecutive exposed portions P and P. Thus, when the TAB wire 4 is connected to the back surface electrode 7, the electric connection between the TAB wire 4 and the back surface electrode 7 is established by the unexposed portions N. Hence, the line width of the back surface alignment mark 71 may be smaller than that of the TAB wire 4 or may be equal to or greater than that of the TAB wire 4. However, in order to provide the TAB wire 4 with a sufficient mechanical connection strength, the back surface alignment mark 72 is preferably equal to or greater the TAB wire 4 in line width. The width of the back surface alignment mark 72 is, for example, about 20% to 200% of the width of the TAB wire 4. In the present embodiment, the width of the back surface alignment mark 72 is about 1.5 mm, like the width of the TAB wire 4. The length dp of the exposed portion P is, for example, about 0.5 mm to 30 mm. In the present embodiment, the length dp is about 12 mm. Furthermore, the length dn of the unexposed portion N is, for example, about 0.5 mm to 30 mm. In the present embodiment, the length dn is about 12 mm.

In the solar battery cell 200, the exposed portions from which the substrate 2 is exposed are formed on the back surface 22 in association with the respective positions on the light receiving surface 21 where the corresponding TAB wires 4 are connected. Each of the exposed portions corresponds to the back surface alignment mark 72 indicative of the position on the back surface 22 where the corresponding TAB wire 4 is to be connected. Hence, the position where the TAB wire 4 is to be connected can be visually identified so that the TAB wire 4 can be accurately connected to the intended position. Furthermore, in the solar battery cell 200, the back surface alignment mark 72 can be easily formed by avoiding applying an electrode material to a portion of the back surface which corresponds to the back surface alignment mark 72 when the back surface electrode 7 is formed. As a result, a possible increase in manufacturing costs can be suppressed.

Furthermore, in the solar battery cell 200, the back surface alignment mark 72 is shaped like a dashed line. This results in a sufficient adhesion area between the TAB wire 4 and the substrate 2 in the exposed portion P from which the substrate 2 is exposed. Additionally, the TAB wire 4 can be provided with a sufficient mechanical connection strength.

Furthermore, in a solar battery module formed of solar battery cells 200, a plurality of the solar battery cells 200 are arranged. The finger electrodes 3 on one of the adjacent solar battery cells 200 are connected to the back surface electrode 7 of the other solar battery cell 200 by the TAB wires 4 each arranged along the corresponding light receiving surface alignment mark 6 and back surface alignment mark 72 via the corresponding conductive adhesion film 5. In such a solar battery module, the TAB wire 4 is accurately connected to the intended position. Thus, the array of the solar battery cells 200 can be restrained from meandering. Hence, when a solar battery module is manufactured, possible residual stress in the solar battery cells 200 can be suppressed, allowing manufacturing yield to be improved.

Now, a solar battery cell according to a third embodiment of the present invention will be described. In the present embodiment, mainly differences from the above-described first embodiment will be described.

Figure 6:
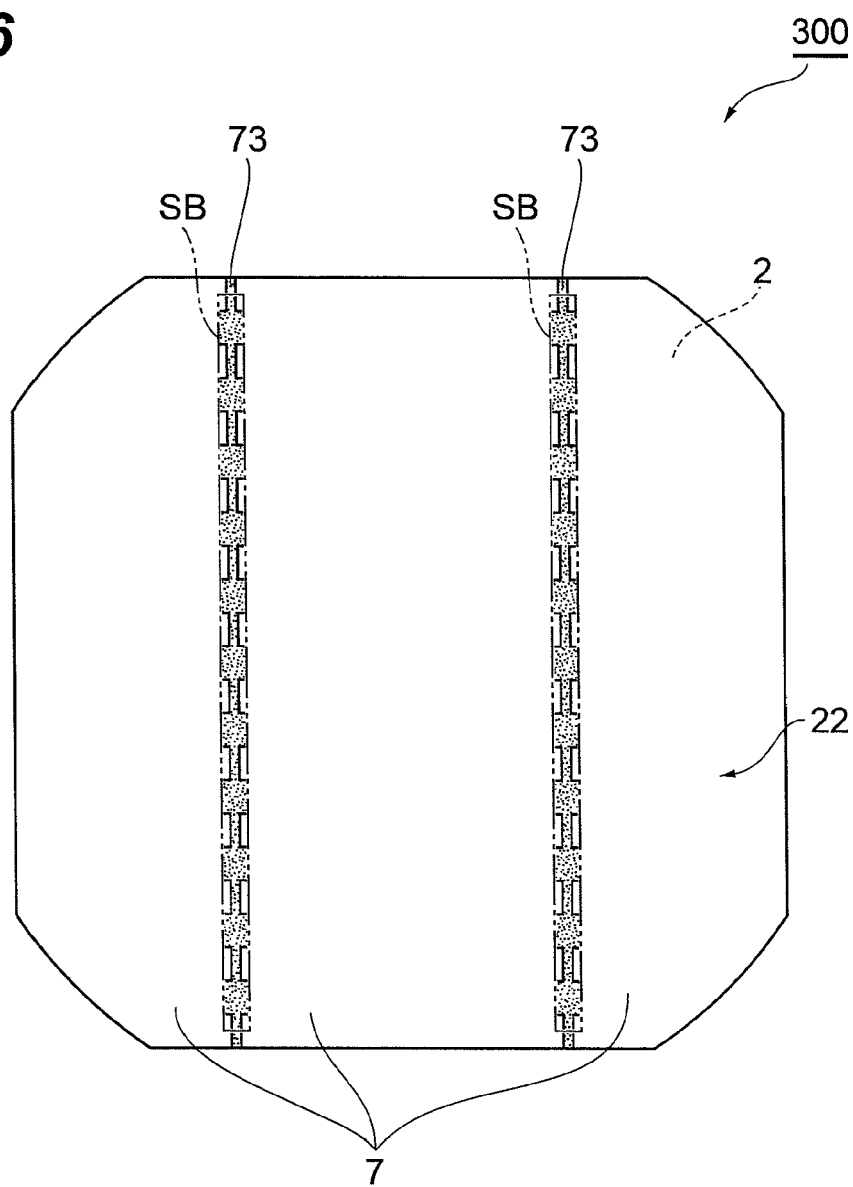
FIG. 6 is a plan view showing a back surface of a solar battery cell according to a third embodiment of the present invention.

FIG. 6 is a plan view showing a back surface of the solar battery cell according to the third embodiment of the present invention. As shown in FIG. 6, a solar battery cell 300 according to the third embodiment is different from the solar battery cell 100 according to the first embodiment (see FIG. 2) in that the solar battery cell 300 includes linear back surface alignment marks 73 varying in thickness depending on a location thereon, instead of the straight line-shaped back surface alignment marks 71.

More specifically, back surface alignment marks 73 are each linearly formed along the corresponding adhesion area SB so as to join two opposite sides of the substrate 2 together. The back surface alignment mark 73 includes thin line portions 73a each smaller than the TAB wire 4 in line width and thick line portions 73b each equal to or greater than the TAB wire 4 in line width; the thin line portions 73a and the thick line portions 73b are consecutively alternately formed. Furthermore, thin line portions 73a, 73a are positioned at the opposite ends of the back surface alignment mark 73.

The width of the thin line portion 73a is, for example, about 0.6 mm, which is the same as the width of the back surface alignment mark 71 according to the first embodiment (see FIG. 2). Furthermore, the width of the thick line portion 73b is, for example, 20% to 200% of the width of the TAB wire 4, and is about 1.5 mm according to the present embodiment; the width of the thick line portion 73b is the same as that of the TAB wire 4. The length of the thin line portion 73a and the length of the thick line portion 73b are, for example, each about 0.5 mm to 30 mm, and are each about 12 mm according to the present embodiment.

In the solar battery cell 300 described above, the exposed portions from which the substrate 2 is exposed are formed on the back surface 22 in association with the respective positions on the light receiving surface 21 where the corresponding TAB wires 4 are connected. Each of the exposed portions corresponds to the back surface alignment mark 73 indicative of the position on the back surface 22 where the corresponding TAB wire 4 is to be connected. Hence, the position where the TAB wire 4 is to be connected can be visually identified so that the TAB wire 4 can be accurately connected to the intended position. Furthermore, the back surface alignment mark 73 can be easily formed by avoiding applying an electrode material to a portion of the back surface which corresponds to the back surface alignment mark 73 when the back surface electrode 7 is formed. As a result, a possible increase in manufacturing costs can be suppressed.

Furthermore, in the solar battery cell 300, the back surface alignment mark 73 includes the thin line portions 73a each smaller than the TAB wire 4 to be connected to the substrate in line width and the thick line portions 73b each equal to or greater than the TAB wire 4 in line width; the thin line portions 73a and the thick line portions 73b are consecutively alternately formed. Thus, compared to the solar battery cell 100 according to the first embodiment, the solar battery cell 300 according to the third embodiment is configured such that the thick line portions 73b provide a larger adhesion area between the TAB wire 4 and the substrate 2 and such that the TAB wire 4 is provided with a higher mechanical connection strength.

Additionally, in a solar battery module formed of solar battery cells 300, a plurality of the solar battery cells 300 are arranged. The finger electrodes 3 on one of the adjacent solar battery cells 300 are connected to the back surface electrode 7 of the other solar battery cell 300 by the TAB wires 4 each arranged along the corresponding light receiving surface alignment mark 6 and back surface alignment mark 73 via the corresponding conductive adhesion film 5. In such a solar battery module, the TAB wire 4 is accurately connected to the intended position. Thus, the array of the solar battery cells 300 can be restrained from meandering. Hence, when a solar battery module is manufactured, possible residual stress in the solar battery cells 300 can be suppressed, allowing manufacturing yield to be improved.

Now, a solar battery cell according to a fourth embodiment of the present invention will be described. In the present embodiment, mainly differences from the above-described third embodiment will be described.

Figure 7:
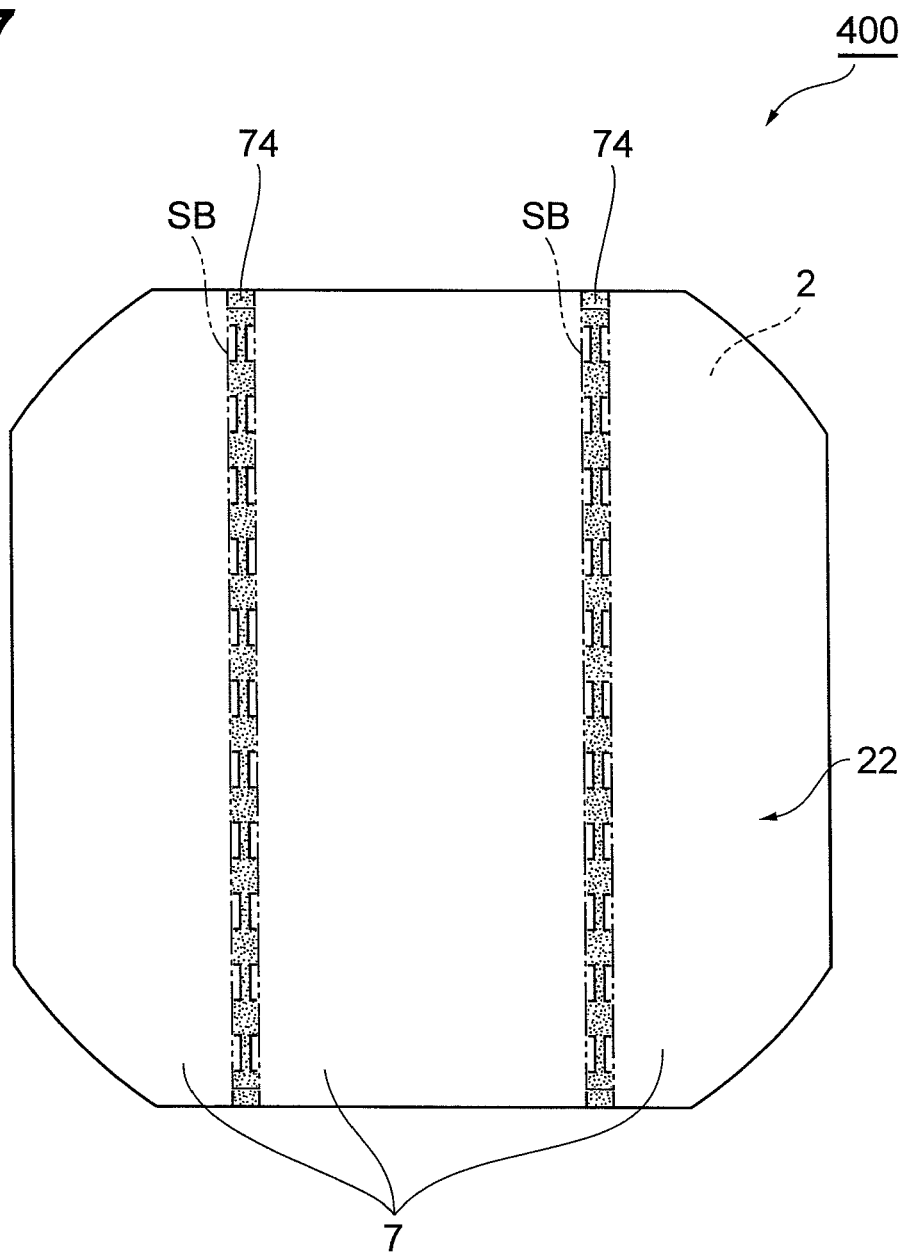
FIG. 7 is a plan view showing a back surface of a solar battery cell according to a fourth embodiment of the present invention.

FIG. 7 is a plan view showing a back surface of the solar battery cell according to the fourth embodiment of the present invention. As shown in FIG. 7, a solar battery cell 400 according to the fourth embodiment is different from the solar battery cell 300 according to the third embodiment (see FIG. 6) in that the solar battery cell 400 includes back surface alignment marks 74 each with the thick line portions 73b, 73b positioned at the opposite ends of the back surface, instead of the back surface alignment marks 73 each with the thin line portions 73a, 73a positioned at the opposite ends of the back surface.

Of course, the solar battery cell 400 described above exerts effects similar to those of the solar battery cell 300 according to the third embodiment.

Now, a solar battery cell according to a fifth embodiment of the present invention will be described. In the present embodiment, mainly differences from the above-described third embodiment will be described.

Figure 8:
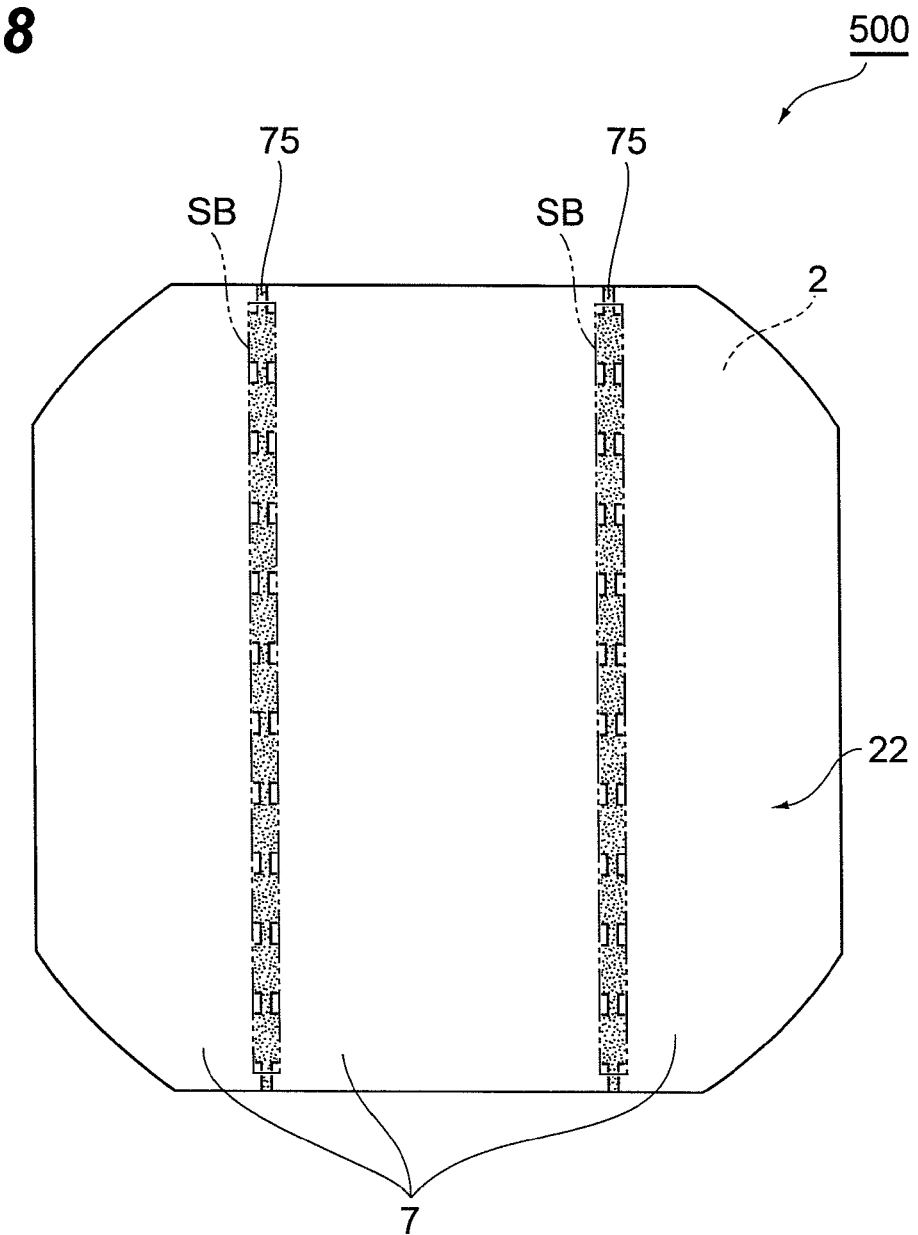
FIG. 8 is a plan view showing a back surface of a solar battery cell according to a fifth embodiment of the present invention.

FIG. 8 is a plan view showing a back surface of the solar battery cell according to the fifth embodiment of the present invention. As shown in FIG. 8, a solar battery cell 500 according to the fifth embodiment is different from the solar battery cell 300 according to the third embodiment (see FIG. 6) in that the solar battery cell 500 includes back surface alignment marks 75 each with the thick line portions 73b longer than the thin line portions 73a, instead of the back surface alignment marks 73 each with the thin line portions 73a and the thick line portions 73b similar in length.

Of course, the solar battery cell 500 described above exerts effects similar to those of the solar battery cell 300 according to the third embodiment.

Furthermore, in the solar battery cell 500, the thick line portion 73b is longer than the thin line portion 73a. Thus, compared to the solar battery cell 300 according to the third embodiment, the solar battery cell 500 is configured such that the thick line portions 73b provide a larger adhesion area between the TAB wire 4 and the substrate 2 and such that the TAB wire 4 is provided with a higher mechanical connection strength.

Now, a solar battery cell according to a sixth embodiment of the present invention will be described. In the present embodiment, mainly differences from the above-described third embodiment will be described.

Figure 9:
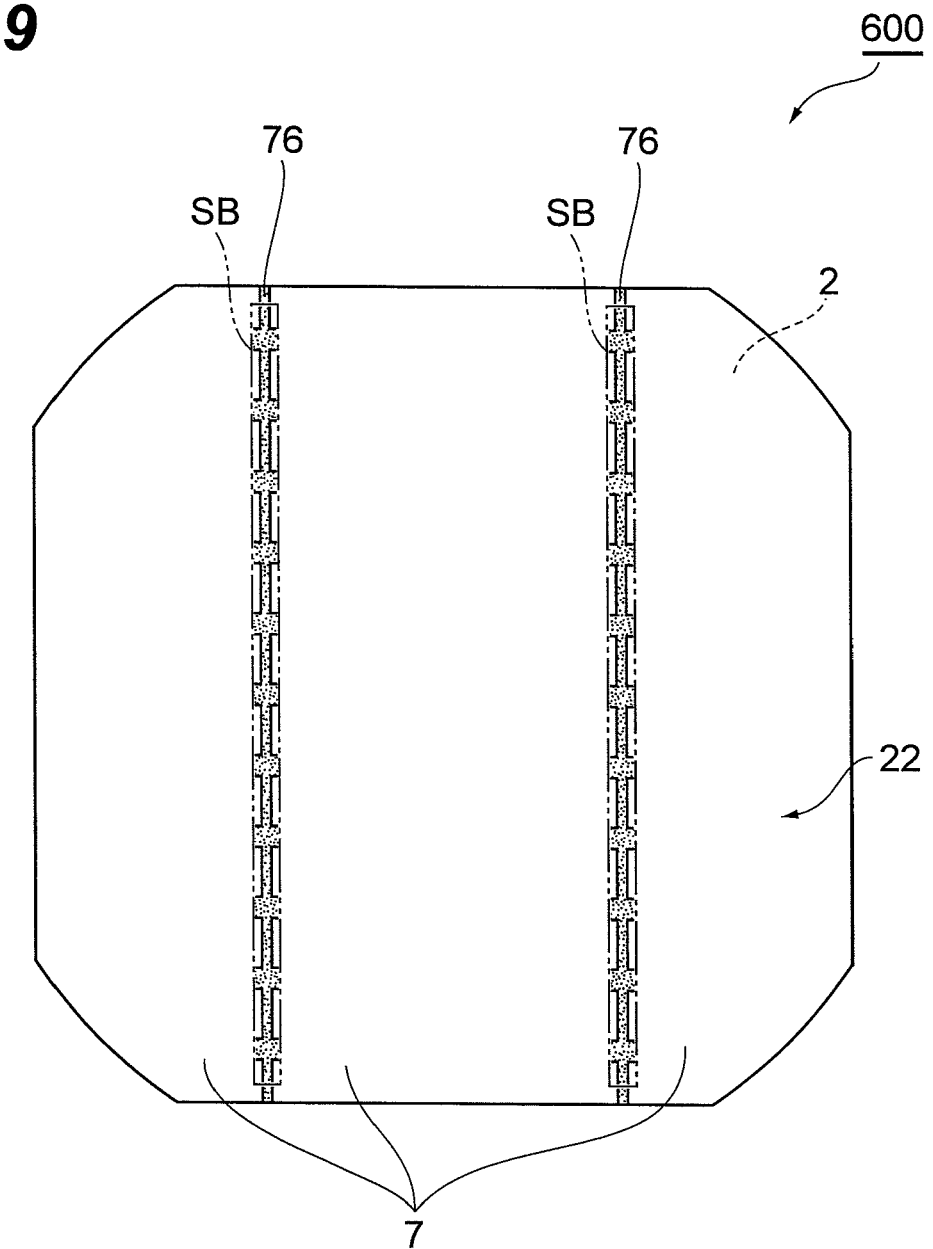
FIG. 9 is a plan view showing a back surface of a solar battery cell according to a sixth embodiment of the present invention.

FIG. 9 is a plan view showing a back surface of the solar battery cell according to the sixth embodiment of the present invention. As shown in FIG. 9, a solar battery cell 600 according to the sixth embodiment is different from the solar battery cell 300 according to the third embodiment (see FIG. 6) in that the solar battery cell 600 includes back surface alignment marks 76 each with the thick line portions 73b shorter than the thin line portions 73a, instead of the back surface alignment marks 73 each with the thin line portions 73a and the thick line portions 73b similar in length.

Of course, the solar battery cell 600 described above exerts effects similar to those of the solar battery cell 300 according to the third embodiment.

Now, a solar battery cell according to a seventh embodiment of the present invention will be described. In the present embodiment, mainly differences from the above-described first embodiment will be described.

Figure 10:
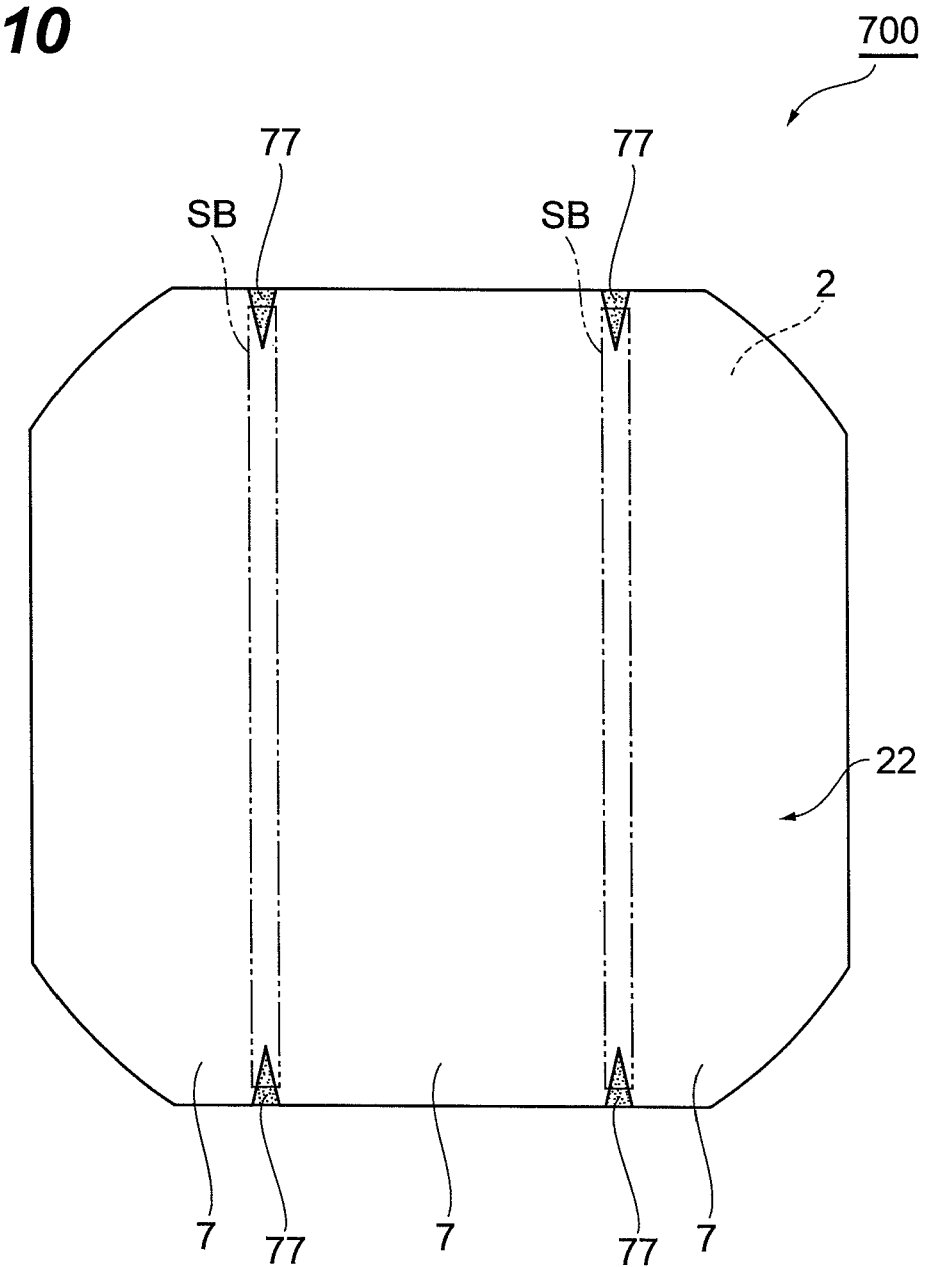
FIG. 10 is a plan view showing a back surface of a solar battery cell according to a seventh embodiment of the present invention.

FIG. 10 is a plan view showing a back surface of the solar battery cell according to the seventh embodiment of the present invention. As shown in FIG. 10, a solar battery cell 700 according to the seventh embodiment is different from the solar battery cell 100 according to the first embodiment (see FIG. 2) in that the solar battery cell 700 includes cutout-shaped back surface alignment marks 77 instead of the straight line-shaped back surface alignment marks 71.

Each of the back surface alignment marks 77, 77 is shaped like a triangular cutout at an end of the substrate 2 located on an extension of the TAB wire 4 to be connected to the substrate 2. The cutout may be shaped like a rectangle, a semicircle, or the like. In short, the cutout may be shaped such that the substrate 2 is exposed from the cutout.

In the solar battery cell 700 described above, the exposed portions from which the substrate 2 is exposed are formed on the back surface 22 in association with the respective positions on the light receiving surface 21 where the corresponding TAB wires 4 are connected. Each of the exposed portions corresponds to the back surface alignment mark 77 indicative of the position on the back surface 22 where the corresponding TAB wire 4 is to be connected. Hence, the position where the TAB wire 4 is to be connected can be visually identified so that the TAB wire 4 can be accurately connected to the intended position. Furthermore, the back surface alignment mark 77 can be easily formed by avoiding applying an electrode material to a portion of the back surface which corresponds to the back surface alignment mark 77 when the back surface electrode 7 is formed. As a result, a possible increase in manufacturing costs can be suppressed.

Furthermore, in the solar battery cell 700, the back surface alignment mark 77 may be shaped like a cutout at the end of the substrate 2 located on the extension of the TAB wire 4 to be connected to the substrate 2. Thus, dimensional management and the like can be more easily carried out on the back surface alignment mark 77 than on the back surface alignment marks 71 to 76 in the solar battery cells 100 to 600 according to the above-described first to sixth embodiments, respectively. Thus, a portion of the back surface which corresponds to the back surface alignment mark 77 can be easily set when the back surface electrode 7 is formed. Hence, the back surface electrode 7 can be easily formed.

Furthermore, in a solar battery module formed of solar battery cells 700, a plurality of the solar battery cells 700 are arranged. The finger electrodes 3 on one of the adjacent solar battery cells 700 are connected to the back surface electrode 7 of the other solar battery cell 700 by the TAB wires 4 each arranged along the corresponding light receiving surface alignment mark 6 and back surface alignment mark 77 via the corresponding conductive adhesion film 5. In such a solar battery module, the TAB wire 4 is accurately connected to the intended position. Thus, the array of the solar battery cells 700 can be restrained from meandering. Hence, when a solar battery module is manufactured, possible residual stress in the solar battery cells 700 can be suppressed, allowing manufacturing yield to be improved.

The preferred embodiments of the solar battery cell according to the present invention have been described in detail. However, the present invention is not limited to the above-described embodiments. For example, in the above-described embodiments, the TAB wire 4 is connected to the finger electrodes 3 via the conductive adhesion film 5. However, the TAB wire 4 may be electrically connected to the finger electrodes 3 by providing a bus bar electrode formed of Ag or the like at the position on the light receiving surface 21 where the TAB wire 4 is to be connected and connecting the bus bar electrode to the TAB wire 4 by solder.

Furthermore, the above-described embodiments use the film-like conductive adhesion film 5 as a conductive adhesive. However, a liquid conductive adhesive may be applied.

If any of the plurality of solar battery cells forming the solar battery module is inferior to the other solar battery cells in photoelectric characteristics such as voltage or current characteristics, the photoelectric characteristics of the whole solar battery module may be degraded under the effect of the solar battery cell with the inferior photoelectric characteristics. The following method is preferable for restraining the photoelectric characteristics of the solar battery module from being degraded: the photoelectric characteristics of the solar battery cells for the solar battery module are premeasured so that the solar battery module can be formed by coupling together solar battery cells determined to have equivalent photoelectric characteristics.

Figure 11:
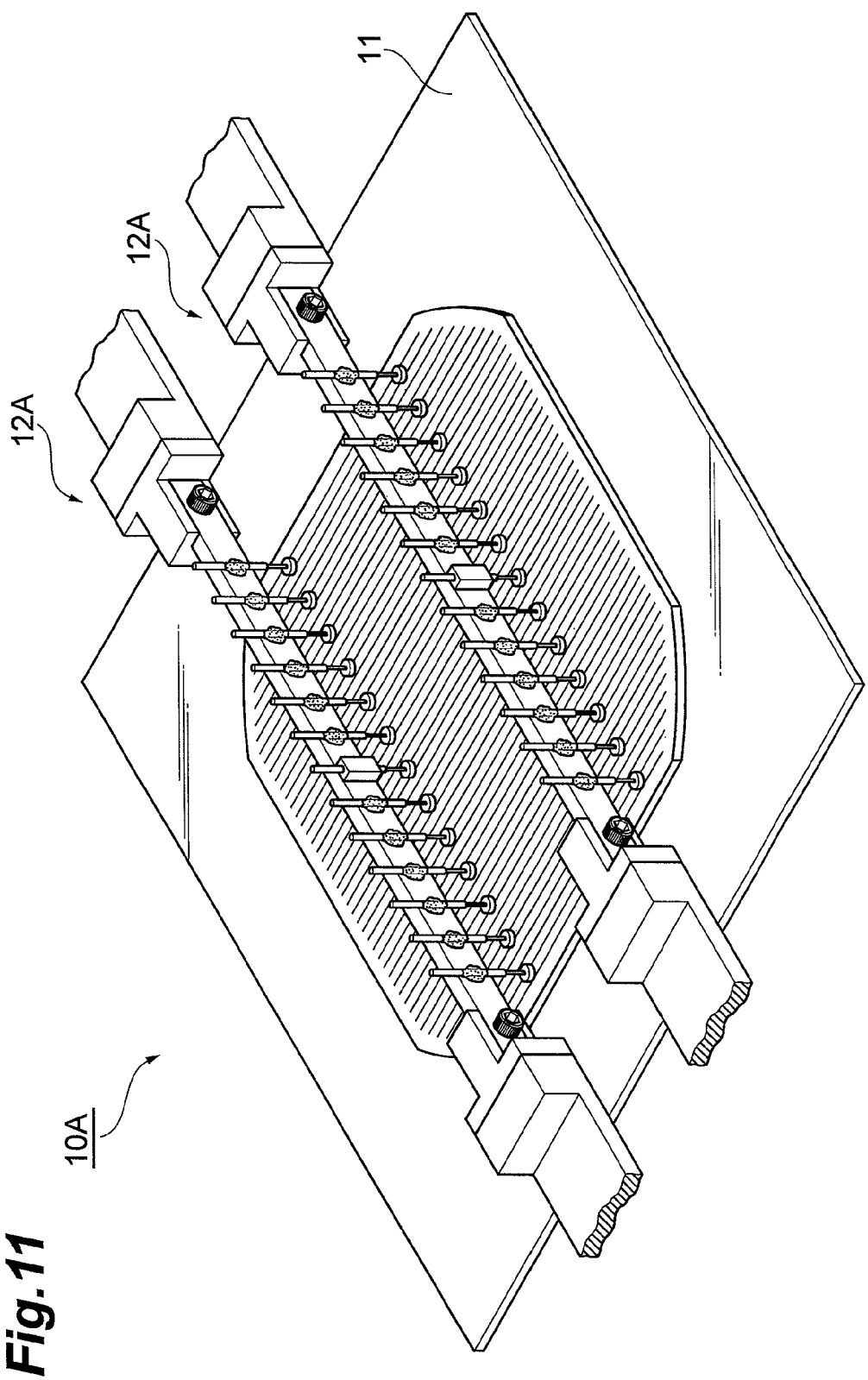
FIG. 11 is a schematic diagram showing a conventional measurement apparatus.
Figure 12:
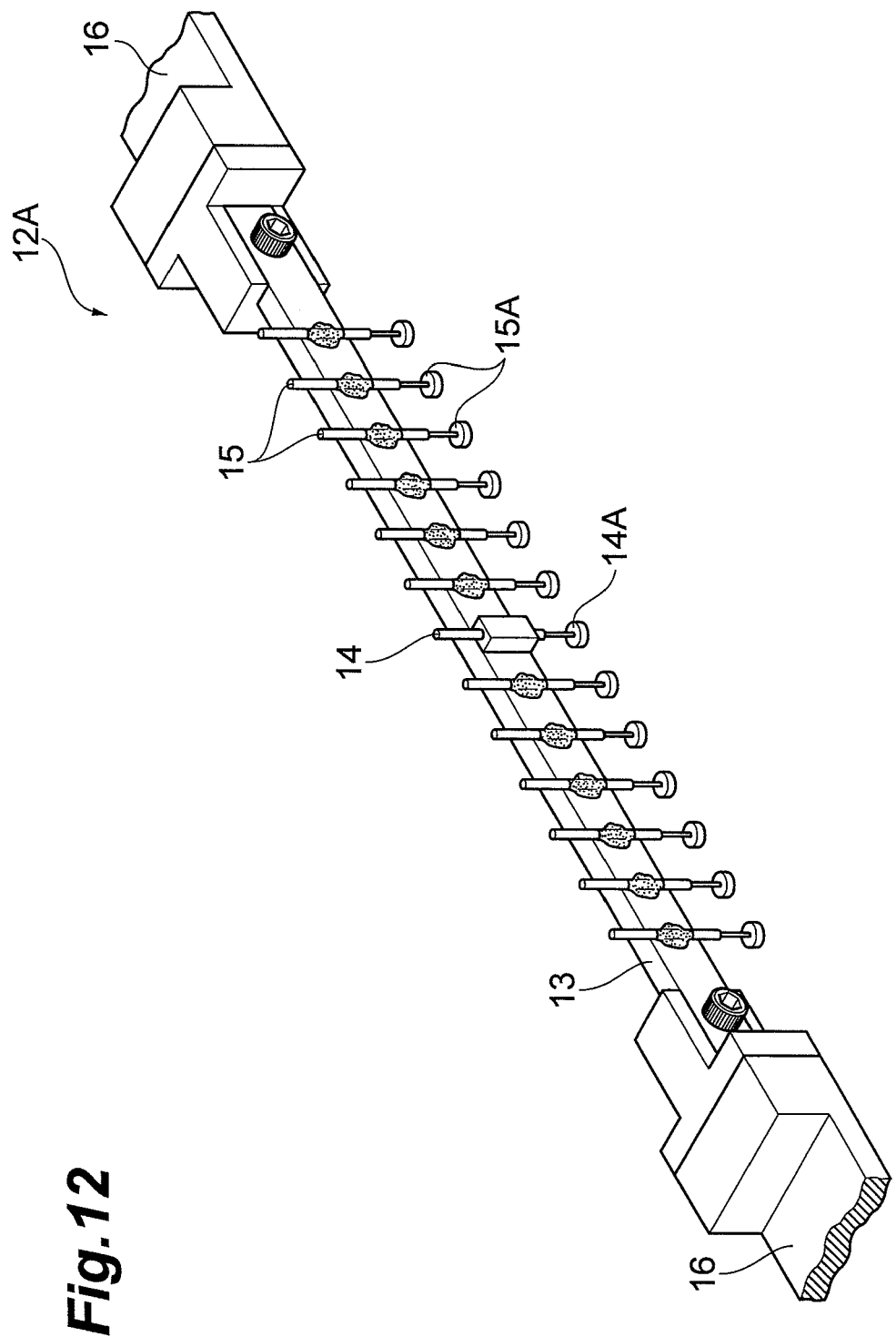
FIG. 12 is a schematic diagram showing a probe for the measurement apparatus in FIG. 11.

FIG. 11 is a schematic diagram showing a conventional measurement apparatus. FIG. 12 is a schematic diagram showing a probe for the measurement apparatus in FIG. 11. As shown in FIG. 11, a conventional measurement apparatus 10A configured to measure the photoelectric characteristics of solar battery cells includes a surface electrode 11 and paired probes 12A, 12A.

The surface electrode 11 is shaped like, for example, a generally square flat plate and formed of, for example, brass. A solar battery cell is placed on a top surface of the surface electrode 11 so that the back surface electrode of the solar battery cell contacts the surface electrode 11. The probe 12A is elongate, and the paired probes 12A, 12A are arranged away from each other so as to lie parallel to each other over the surface electrode 11.

As shown in FIG. 12, the probe 12A includes a bar 13, a voltage probe pin 14, a plurality of current probe pins 15, and bar support members 16, 16.

The bar 13 is an elongate member and is formed of, for example, copper. The voltage probe pin 14 is used to measure photoelectric characteristics such as voltage characteristics. The voltage probe pin 14 is attached to the bar 13 in a substantially central portion thereof in a longitudinal direction thereof. The voltage probe pin 14 is attached to the bar 13 via an insulating member so as to be electrically insulated from the bar 13. Thus, the voltage probe pin 14 is also insulated from the current probe pins 15. A tip of the voltage probe pin 14 forms a circular contact portion 14A.

The current probe pins 15 are used to measure the photoelectric characteristics such as the current characteristics. The plurality of current probe pins 15 are attached to the bar 13 so as to lie symmetrically with respect to the voltage probe pin 14 along the longitudinal direction of the bar 13 and away from one another substantially like a straight line. The plurality of current probe pins 15 are attached to the bar 13 so as to be each electrically continuous with the bar 13. A tip of each of the current probe pins 15 forms a circular contact portion 15A.

The bar support members 16 support the bar 13. The paired bar support members 16, 16 are attached to the respective ends of the bar 13. The probe 12A is provided on a base or the like (not shown in the drawings) on which the surface electrode 11 is mounted, via the bar support members 16, 16 so that the contact portion 14A and the contact portions 15A lie opposite the surface electrode 11 (see FIG. 11). The bar support member 16 includes a drive mechanism (not shown in the drawings) configured to drive the bar 13 up and down. The drive mechanism enables the solar battery cell placed on the top surface of the surface electrode 11 to be pressed by the contact portion 14A and the contact portions 15A. Furthermore, the bar support member 16 includes an adjustment mechanism (not shown in the drawings) configured to adjust the lateral direction position of the bar 13 in the horizontal direction.

In the conventional measurement apparatus 10A, a conventional solar battery cell with a bus bar electrode is placed on the top surface of the surface electrode 11 so that the bus bar electrode lies parallel to the probe 12A. The horizontal position of the bar 13 is adjusted so that the bus bar electrode lies opposite the probe 12A. Then, the bar 13 is moved downward to allow the contact portion 14A and the contact portions 15A to press the bus bar electrode. The light receiving surface of the solar battery cell is then irradiated with pseudo sunlight. Then, the voltage and current characteristics of the solar battery cell can be measured.

In the present embodiments, the solar battery cells 100, 200, 300, 400, 500, 600, 700 include no bus bar electrode, and the light receiving surface alignment marks 6 are shaped like dashed lines (see FIG. 1). Thus, the plurality of finger electrodes 3 fail to be electrically continuous with one another. Hence, if the electrical characteristics of the solar battery cells 100 to 700 are measured using the conventional measurement apparatus, the intervals among the finger electrodes 3 need to be set equal to those among the current probe pins 15 so that the current probe pins 15 can be pressed against the respective finger electrodes 3. In this case, when several types of solar battery cells with different finger electrode intervals are to be subjected to measurement, different types of probes need to be prepared for respective types of solar battery cells with the different finger electrode intervals. This may increase the costs of the measurement apparatus.

Figure 13:
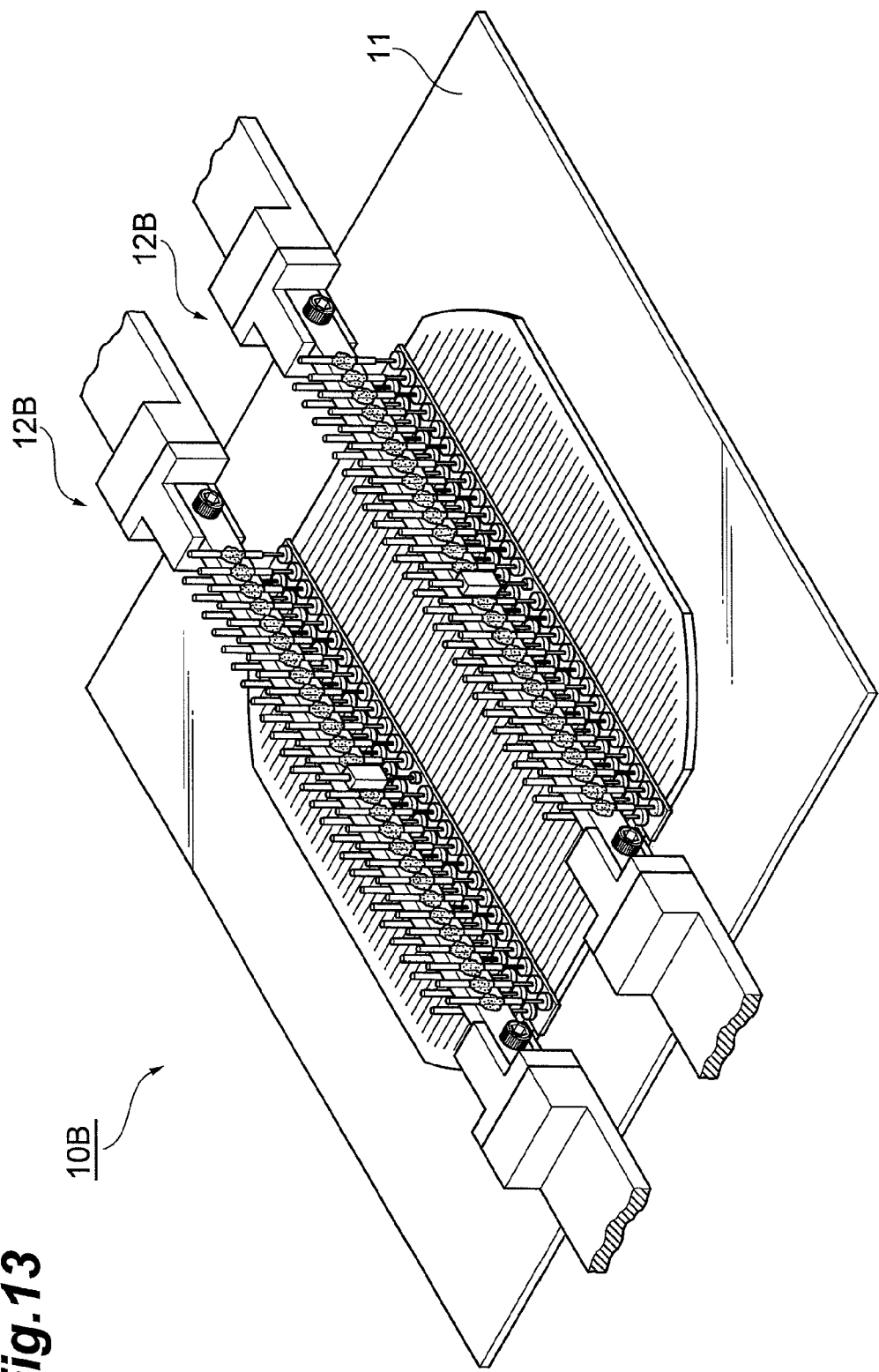
FIG. 13 is a schematic diagram showing a measurement apparatus for a solar battery cell according to the present invention.
Figure 14:
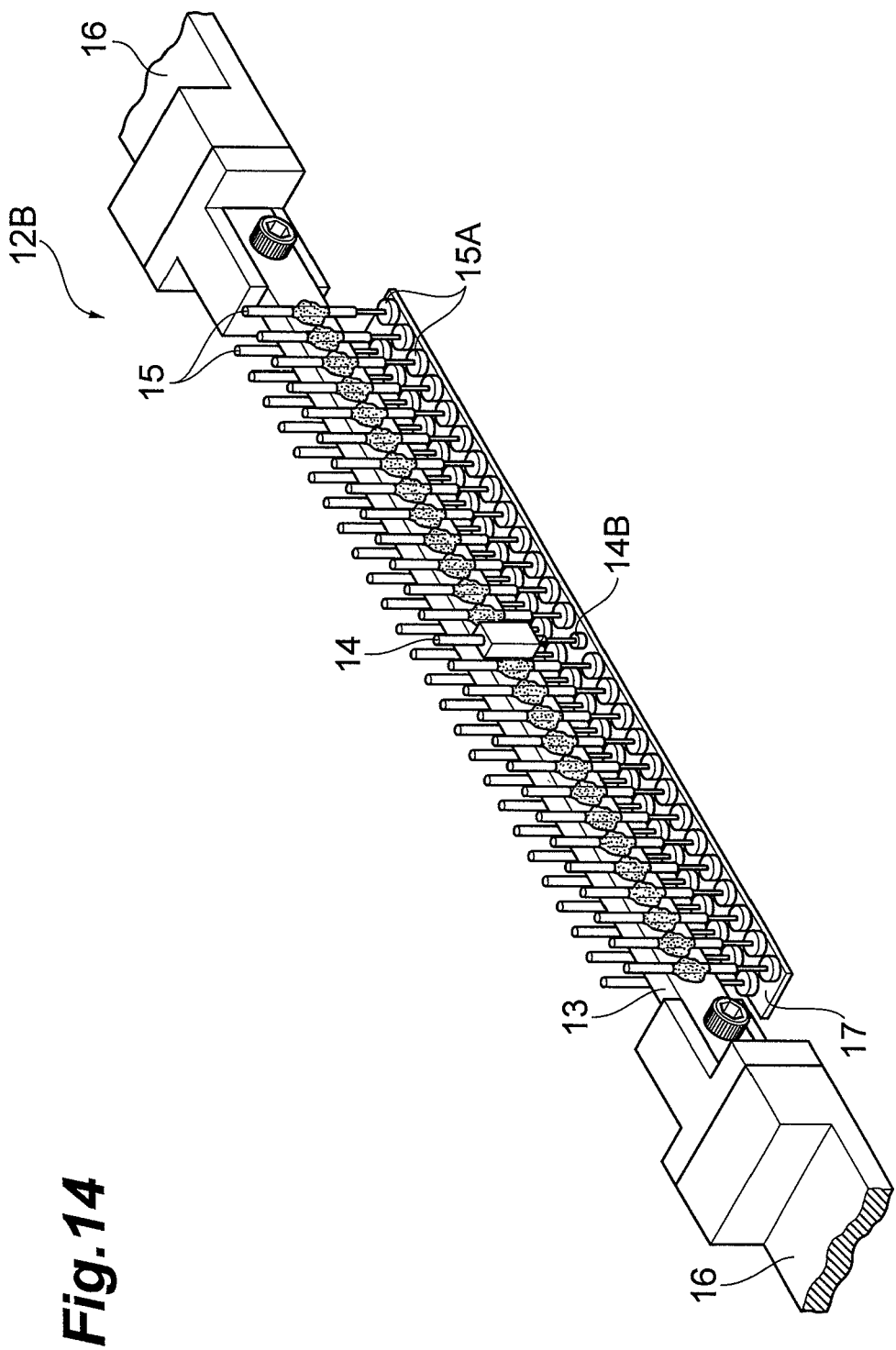
FIG. 14 is a schematic diagram showing a probe for the measurement apparatus in FIG. 13.

In contrast, FIG. 13 is a schematic diagram showing a measurement apparatus for a solar battery cell according to the present invention. FIG. 14 is a schematic diagram showing a probe for the measurement apparatus in FIG. 13. A measurement apparatus 10B for a solar battery cell according to the present invention is different from the conventional measurement apparatus 10A in a configuration around the current probe pins 15.

More specifically, in the measurement apparatus 10B, a plurality of the current probe pins 15 are attached to the bar 13 so as to lie substantially symmetrically with respect to the voltage probe pin 14 along the longitudinal direction of the bar 13 and closely in a staggered manner. A contact portion 14B of the voltage probe pin 14 is coupled to contact portions 15A of the current probe pins 15 by a plate electrode 17. In the measurement apparatus 10B, the contact portion 14B of the voltage probe pin 14 has a smaller diameter than the contact portion 14A in the conventional measurement apparatus 10A. The plate electrode 17 is an elongate plate-like member and is formed of, for example, a solder plated copper wire, which is a material similar to that of the TAB wire.

In the measurement apparatus 10B described above, for example, the solar battery cell 100 is placed on the top surface of the surface electrode 11 so that the probe 12B lies substantially at right angles to the finger electrodes 3 (see FIG. 11). Then, the bar 13 is moved downward so that the plate electrode 17 presses all the finger electrodes 3. The light receiving surface of the solar battery cell 100 is then irradiated with pseudo sunlight. Then, the voltage and current characteristics of the solar battery cell can be measured at a time.

As described above, in the measurement apparatus 10B for the solar battery cell according to the present invention, the plate electrode 17 is mounted so as to stride across the contact portion 14B of the voltage probe pin 14 and the contact portions 15A of the current probe pins 15. Thus, even for the solar battery cells 100 to 700, which include no bus bar electrode and in which the plurality of finger electrodes 3 are not electrically continuous with one another, the photoelectric characteristics can be measured at a time.

Furthermore, in the measurement apparatus 10B for the solar battery cell according to the present invention, the current probe pins 15 are closely arranged in the longitudinal direction of the bar 13. This enables the plate electrode 17 to evenly press the solar battery cell. Hence, the photoelectric characteristics can be appropriately measured.

In the measurement apparatus 10B with the plate electrode 17, each of the contact portion 14B and the contact portions 15A need not necessarily be circular but may be shaped like, for example, a needle. Furthermore, the material of the plate electrode 17 need not necessarily be similar to that of the TAB wire but may be any other metal.

Now, the results of measurement of the photoelectric characteristics of the solar battery cell will be described. Table 1 shows the results of the measurement, using the conventional measurement apparatus, of the photoelectric characteristics of the conventional solar battery cell with the bus bar electrode as well as the results of the measurement, using the measurement apparatus (new measurement apparatus) with the plate electrode, of the photoelectric characteristics of the solar battery cell with no bus bar electrode and the plurality of finger electrodes not electrically continuous with one another. The two solar battery cells used for the measurements are similar to each other except that one of the solar battery cells includes a bus bar electrode, whereas the other does not.

TABLE 1

| Measurement apparatus | Solar battery cell | η (%) | F.F (%) | Voc (V) | Isc (A) | Rs (Ω) |
|---|---|---|---|---|---|---|
| Conventional measurement apparatus (without plate electrode) | With bus bar electrode | 15.00 | 73.08 | 0.616 | 8.107 | 0.008 |
| New measurement apparatus (with plate electrode) | Without bus bar electrode | 15.05 | 73.61 | 0.615 | 8.097 | 0.008 |

Table 1 shows that in terms of all of a conversion efficiency η (%), a filter factor F.F (%), an open voltage property Voc (V), a short-circuit current property Isc (A), and a series resistance property Rs (Ω), which are photoelectric characteristics, similar measurement results were obtained for the measurement, using the conventional measurement apparatus, of the photoelectric characteristics of the conventional solar battery cell with the bus bar electrode and for the measurement, using the new measurement apparatus with the plate electrode, of the photoelectric characteristics of the solar battery cell with no bus bar electrode and the plurality of finger electrodes not electrically continuous with one another.

In the above embodiment, although the alignment marking of the back surface corresponds to the exposed portion from which the substrate 2 is exposed, the alignment marking of the back surface may also correspond to a portion from which the back surface electrode 7 is omitted to a degree such that the substrate 2 is not exposed. For example, the alignment marking of the back surface may be a groove, etc. provided on the back surface electrode 7. In other words, the alignment marking of the back surface may be an omitted portion (including both the exposed portion and the groove, etc.) from which the back surface electrode 7 is omitted.

Here, the conductive adhesion film 5 is sometimes relatively less adhesive to the back surface 22 of the substrate 2. In such cases, in the embodiments above, at least one alignment marking (a portion) of the back surface may be filled with an assistant material the conductive adhesion film 5 is thereby relatively attachable. That is, at least one of the back surface alignment markings may be filled with the assistant material and adhesive of the conductive adhesion film 5 to the assistant material may be greater than adhesive to the back surface 22 of the substrate 2 of the conductive adhesion film 5. Furthermore, the back surface alignment markings are not necessarily required to be filled with the assistant material but can only be filled to the extent such that it is covered by the assistant material. As the assistant materials to fill the back surface alignment markings, for example, Ag, Cu, Au, ITO (indium tin oxide), and IZO (indium zinc oxide), etc. can be utilized.

Furthermore, as will be appreciated from the foregoing description, a solar battery module according to the invention can be made by a method that includes: providing a photovoltaic substrate having a plurality of finger electrodes arranged on a light receiving surface thereof, and an alignment marking provided on the light receiving surface and indicating a position where a second TAB wire is to be connected to the finger electrodes via a conductive adhesive, and a back surface electrode substantially covering a back surface of the substrate, the back surface electrode to be connected to a plurality of finger electrodes on an adjacent cell by applying a first TAB wire via a conductive adhesive, wherein a portion of the back surface of the substrate is exposed at a position corresponding to the position on the light receiving surface where the second TAB wire is to be applied; and connecting the first TAB wire to the back surface electrode via the conductive adhesive at the position indicated by the alignment marking of the back surface.

A solar battery module according to the invention can also be made by a method that includes: providing a photovoltaic substrate having a plurality of finger electrodes arranged on a light receiving surface thereof, and a back surface electrode substantially covering a back surface of the substrate, the back surface electrode to be connected to a plurality of finger electrodes on an adjacent cell by applying a first TAB wire via a conductive adhesive, wherein the back surface electrode has omitted portions arranged to define at least one alignment marking of the back surface indicative of a position where the first TAB wire is to be applied, the at least one alignment marking of the back surface having a width less than a width of said first TAB wire; and connecting the first TAB wire to the back surface electrode via the conductive adhesive at the position indicated by the alignment marking of the back surface.

What is claimed is:

1. A solar battery cell comprising a substrate, a plurality of finger electrodes formed on a light receiving surface of the substrate and a back surface electrode substantially covering a back surface of the substrate, the back surface electrode to be connected to a plurality of finger electrodes on an adjacent cell by applying a first TAB wire via a conductive adhesive directly in contact with the back surface electrode, wherein a portion of the back surface of the substrate is exposed at a position corresponding to a position on the light receiving surface where a second TAB wire is to be applied, and the exposed portion constitutes an alignment marking of the back surface indicative of a position where the first TAB wire is to be applied.

2. The solar battery cell according to claim 1, wherein the alignment marking is shaped like a line and has a width smaller than a width of the first TAB wire.

3. The solar battery cell according to claim 2, wherein the alignment marking has a width 20% to 80% of the width of the first TAB wire.

4. The solar battery cell according to claim 2, wherein the alignment marking is linear.

5. The solar battery cell according to claim 1, wherein the alignment marking of the back surface is linear and has first portions having a width smaller than a width of the first TAB wire and second portions having a width equal to or greater than said width of the TAB wire, wherein the first and second portions are alternately arranged along the alignment marking.

6. The solar battery cell of claim 5, wherein said first portions have length equal to a length of said second portions, and one or more of said first portions are located at a periphery of said back surface of said substrate.

7. The solar battery cell of claim 5, wherein said first portions have length equal to a length of said second portions, and one or more of said second portions are located at a periphery of said back surface of said substrate.

8. The solar battery cell of claim 5, wherein said first portions have a length greater than a length of said second portions.

9. The solar battery cell of claim 5, wherein said first portions have a length less than a length of said second portions.

10. The solar battery cell according to claim 1, wherein the alignment marking is linear and comprises alternating first and second regions, wherein in said first regions said back surface is exposed and in said second regions said back surface is covered by said back surface electrode.

11. The solar battery cell according to claim 10, where in the first region has a width 20% to 200% of the width of the first TAB wire.

12. The solar battery cell according to claim 10, wherein the first region has a length of 0.5 mm to 30 mm.

13. The solar battery cell according to claim 1, wherein the alignment marking is constituted by exposed portions of the back surface located at a periphery of said back surface.

14. The solar battery cell according to claim 1, wherein the alignment marking is constituted by a cutout-shaped exposed portion located at a periphery of said back surface.

15. The solar battery cell according to claim 14, wherein the alignment marking is triangle-shape.

16. The solar battery cell according to claim 14, wherein the alignment marking is rectangular-shape.

17. The solar battery cell according to claim 14, wherein the alignment marking is semicircular-shape.

18. A solar battery module comprising:
a plurality of the solar battery cells according to claim 1, wherein:
the first TAB wire is positioned along the alignment marking on one of the plurality of solar battery cells and is connected to the back surface electrode of said one solar battery cell via said conductive adhesive, said conductive adhesive being directly in contact with the back surface electrode, and
the first TAB wire is further connected, as a second TAB wire, to the plurality of finger electrodes of another of the plurality of solar battery cells.

19. A solar battery cell comprising a substrate, a plurality of finger electrodes formed on a light receiving surface of the substrate and a back surface electrode substantially covering a back surface of the substrate, the back surface electrode to be connected to a plurality of finger electrodes on an adjacent cell by applying a first TAB wire via a conductive adhesive directly in contact with the back surface electrode,
wherein a portion of the back surface of the substrate is exposed at a position corresponding to a position on the light receiving surface where a second TAB wire is to be applied.

20. The solar battery cell according to claim 19, wherein the exposed portion is shaped like a line and has a width smaller than a width of the first TAB wire.

21. The solar battery cell according to claim 20, wherein the exposed portion has a width 20% to 80% of the width of the first TAB wire.

22. The solar battery cell according to claim 20, wherein the exposed portion is linear.

23. The solar battery cell according to claim 19, wherein the exposed portion of the back surface is linear and has first portions having a width smaller than a width of the first TAB wire and second portions having a width equal to or greater than said width of the TAB wire, wherein the first and second portions are alternately arranged.

24. The solar battery cell of claim 23, wherein said first portions have length equal to a length of said second portions, and one or more of said first portions are located at a periphery of said back surface of said substrate.

25. The solar battery cell of claim 23, wherein said first portions have length equal to a length of said second portions, and one or more of said second portions are located at a periphery of said back surface of said substrate.

26. The solar battery cell of claim 23, wherein said first portions have a length greater than a length of said second portions.

27. The solar battery cell of claim 23, wherein said first portions have a length less than a length of said second portions.

28. The solar battery cell according to claim 19, wherein the exposed portion is shaped like a dashed line.

29. The solar battery dell according to claim 28, wherein the exposed portion has a width 20% to 200% of the width of the first TAB wire.

30. The solar battery cell according to claim 28, wherein each portion constituting the dashed line has a length of 0.5 mm to 30 mm.

31. The solar battery cell according to claim 19, wherein the exposed portion is located at a periphery of the back surface.

32. The solar battery cell according to claim 19, wherein the exposed portion is cutout-shape and is located at a periphery of said back surface.

33. The solar battery cell according to claim 32, wherein the exposed portion is triangle-shape.

34. The solar battery cell according to claim 32, wherein the exposed portion is rectangular-shape.

35. The solar battery cell according to claim 32, wherein the exposed portion is semicircular-shape.

36. A solar battery module comprising:
a plurality of the solar battery cells according to claim 19, wherein:
the first TAB wire is positioned along the exposed portion on one of the plurality of solar battery cells and is connected to the back surface electrode of said one solar battery cell via said conductive adhesive, said conductive adhesive being directly in contact with the back surface electrode, and the first TAB wire is further connected, as a second TAB wire, to the plurality of finger electrodes of another of the plurality of solar battery cells.

* * * * *